United States Patent
Kuboyama et al.

(10) Patent No.: US 11,143,378 B2
(45) Date of Patent: Oct. 12, 2021

(54) VEHICULAR DISPLAY DEVICE

(71) Applicant: KOITO MANUFACTURING CO., LTD., Tokyo (JP)

(72) Inventors: Osamu Kuboyama, Shizuoka (JP); Masaya Shido, Shizuoka (JP); Toru Ito, Shizuoka (JP); Yoshiro Ito, Shizuoka (JP); Masaru Sasaki, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/371,211

(22) Filed: Apr. 1, 2019

(65) Prior Publication Data

US 2019/0301701 A1  Oct. 3, 2019

(30) Foreign Application Priority Data

Apr. 3, 2018 (JP) .............................. JP2018-071866
Apr. 17, 2018 (JP) .............................. JP2018-079442

(51) Int. Cl.
*F21S 43/40* (2018.01)
*F21S 43/239* (2018.01)
(Continued)

(52) U.S. Cl.
CPC .......... *F21S 43/239* (2018.01); *F21S 43/241* (2018.01); *F21S 43/40* (2018.01); *F21S 41/25* (2018.01);
(Continued)

(58) Field of Classification Search
CPC .......... F21V 41/40; F21V 41/25; F21V 41/50; F21V 41/64; F21V 43/40; G02F 2001/133616
See application file for complete search history.

(56) References Cited

U.S. PATENT DOCUMENTS

| 7,021,806 B2 * | 4/2006 | Ovenshire | ............... G09F 13/04 362/300 |
| 2002/0021385 A1 | 2/2002 | Nakabayashi et al. | |

(Continued)

FOREIGN PATENT DOCUMENTS

| CN | 1318767 A | 10/2001 |
| CN | 2454195 Y | 10/2001 |

(Continued)

OTHER PUBLICATIONS

Office Action issued in Chinese Application No. 201910206197.7, dated Dec. 24, 2020 (23 pages).

(Continued)

*Primary Examiner* — Julie A Bannan
(74) *Attorney, Agent, or Firm* — Osha Bergman Watanabe & Burton LLP

(57) ABSTRACT

A vehicular display device includes: a reflective display configured to provide display toward an outside of a vehicle; and a light emission member arranged to face a display part of the reflective display. The light emission member is configured to allow light to be incident from a display part side and light to be incident from an opposite side to the display part side to pass through the light emission member, and is configured to emit light toward the display part, which is different from the light to be incident from the display part side and the light to be incident from the opposite side to the display part side.

6 Claims, 19 Drawing Sheets

(51) Int. Cl.
    *F21S 43/241*     (2018.01)
    *F21S 45/47*     (2018.01)
    *F21S 45/43*     (2018.01)
    *F21W 103/35*     (2018.01)
    *F21Y 115/15*     (2016.01)
    *F21Y 115/10*     (2016.01)
    *F21W 103/20*     (2018.01)
    *F21S 41/40*     (2018.01)
    *F21S 41/25*     (2018.01)
    *G02F 1/1335*     (2006.01)

(52) U.S. Cl.
    CPC ............... *F21S 41/40* (2018.01); *F21S 45/43* (2018.01); *F21S 45/47* (2018.01); *F21W 2103/20* (2018.01); *F21W 2103/35* (2018.01); *F21Y 2115/10* (2016.08); *F21Y 2115/15* (2016.08); *G02F 1/133616* (2021.01)

(56) References Cited

U.S. PATENT DOCUMENTS

| | | |
|---|---|---|
| 2002/0085150 A1 | 7/2002 | Funamoto et al. |
| 2004/0218400 A1 | 11/2004 | Egashira |
| 2005/0002175 A1 | 1/2005 | Matsui et al. |
| 2005/0253699 A1 | 11/2005 | Madonia |
| 2010/0302794 A1* | 12/2010 | Oomen ............... F21V 7/0025 362/519 |
| 2016/0243979 A1* | 8/2016 | Langkabel ............ F21S 43/249 |

FOREIGN PATENT DOCUMENTS

| | | |
|---|---|---|
| CN | 1362636 A | 8/2002 |
| CN | 1550376 A | 12/2004 |
| CN | 1596358 A | 3/2005 |
| CN | 107304999 A | 10/2017 |
| JP | H11329745 A | 11/1999 |
| JP | 2001110221 A | 4/2001 |
| JP | 2004126294 A | 4/2004 |
| JP | 2007-531904 A | 11/2007 |

OTHER PUBLICATIONS

Office Action issued in corresponding Chinese Application No. 201910206197.7; dated Jul. 20, 2021 (18 pages).

* cited by examiner

VEHICULAR DISPLAY DEVICE

CROSS-REFERENCE TO RELATED APPLICATIONS

This application is based on and claims priority under 35 USC 119 from Japanese Patent Application No. 2018-071866 filed on Apr. 3, 2018 and Japanese Patent Application No. 2018-079442 filed on Apr. 17, 2018, the contents of which are incorporated herein by reference.

TECHNICAL FIELD

The present invention relates to a vehicular display device, and particularly, to providing display toward an outside of a vehicle.

BACKGROUND ART

A vehicular display device configured to display information about vehicle states and the like toward an outside has been known. As the vehicular display device, a display device such as a liquid crystal display device may be used. For example, JP-A-2007-531904 (PTL 1) discloses such a vehicular display device.

As the display device, a self-luminous display having a light source and configured to provide display by light to be emitted from the light source has been known. It is considered to combine the self-luminous display and the vehicular display device as disclosed in PTL 1. In this case, the self-luminous display is used outdoor during the daytime for which the sunlight is irradiated. However, in the environment where the sunlight is irradiated, luminance of the light to be emitted from a display part of the self-luminous display is lower than the surrounding luminance, so that visibility of information to be displayed on the display part tends to be lowered. For this reason, there is a need for suppressing the visibility of the information, which is to be displayed by the vehicular display device during the daytime, from being lowered.

Regarding the above need, it is considered to combine a reflective display configured to reflect and emit light to be incident on the display part for display and the vehicular display device as disclosed in PTL 1. In the environment where the sunlight is irradiated, the reflective display can display the information by using the sunlight. In general, since the luminance of the sunlight is higher than the luminance of the light to be emitted from the light source of the self-luminous display, it is possible to increase the luminance of the light to be emitted from the display part of the reflective display, as compared to the self-luminous display. For this reason, the combination of the reflective display and the vehicular display device can suppress the visibility of the information, which is to be displayed by the vehicular display device in the environment where the sunlight is irradiated, from being lowered.

However, in the case of the reflective display, a sufficient amount of light to be incident on the display part may not be obtained in an environment where a part of light to be directed toward the display part of the reflective display is blocked by a member of a vehicle such as a body or in a dark environment such as night-time, for example. In this case, the luminance of the light to be emitted from the display part of the reflective display is lowered, so that the visibility of the information to be displayed on the display part may be lowered.

Also, in the reflective display, a sufficient amount of the light to be incident on the display part may not be obtained in the dark environment such as night-time. In this case, the luminance of the light to be emitted from the display part of the reflective display is lowered, so that the visibility of the information to be displayed on the display part may be lowered. For this reason, there is a need for suppressing the visibility of the information to be displayed from being lowered even in the dark environment such as night-time.

SUMMARY OF INVENTION

Aspect of non-limiting embodiments of the present disclosure is aimed at providing a vehicular display device capable of suppressing visibility of information to be displayed from being lowered.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

In order to achieve the above aim, a vehicular display device includes: a reflective display configured to provide display toward an outside of a vehicle; and a light emission member arranged to face a display part of the reflective display. The light emission member is configured to allow light to be incident from a display part side and light to be incident from an opposite side to the display part side to pass through the light emission member, and to emit light toward the display part, which is different from the light to be incident from the display part side and the light to be incident from the opposite side to the display part side.

In the vehicular display device, the light emission member is located at an outermore side of the vehicle than the display part, and is configured to allow the light to be incident from the display part side and the light to be incident from the opposite side to the display part side to pass therethrough. For this reason, outside light, which is light from a light source such as the sun, a streetlamp and the like located outside the vehicle, is incident from a side of the light emission member opposite to the display part side, and the outside light incident on the light emission member can be incident on the display part through the light emission member. Also, the light to be emitted from the display part can be emitted from the side of the light emission member opposite to the display part side through the light emission member. For this reason, the reflective display can display the information by using the outside light including the sunlight, and can suppress the visibility of the information from being lowered in the environment where the sunlight is irradiated, as compared to the self-luminous display. Also, since the light emission member emits light, which is different from the light to be incident from the display part side and the light to be incident from the opposite side to the display part side, toward the display part, the reflective display can provide display by using the outside light to pass through the light emission member and the light to be emitted from the light emission member toward the display part. For this reason, even when an amount of the light to be incident on the display part through the light emission member is lowered, it is possible to suppress the luminance of the light to be emitted from the display part of the reflective display from being lowered. In this way, the vehicular display device can suppress the visibility of the information to be displayed from being lowered.

The light emission member may be a light guide plate of which one surface is arranged to face the display part. The light guide plate may have an incidence surface on which light is to be incident, which is different from light to be incident from the one surface and the other surface, and the other surface of the light guide plate may be provided with a plurality of step regions in which steps configured to internally reflect the light to be incident from the incidence surface toward the display part are formed, and a planar region located between the step regions.

With the above configuration, the light to be incident from the planar region of the other surface of the light guide plate can be incident on the display part through the light guide plate. Also, the light emitted from the display part and incident on one surface of the light guide plate can be emitted from the planar region of the other surface of the light guide plate through the light guide plate. For this reason, the reflective display can display the information by using the outside light including the sunlight, and can suppress the visibility of the information from being lowered in the environment where the sunlight is irradiated, as compared to the self-luminous display. Also, since the light guide plate is configured to internally reflect the light to be incident from the incidence surface toward the display part by the steps, the light to be incident from the incidence surface can be emitted from one surface of the light guide plate and can be incident on the display part. For this reason, the reflective display can provide display by using the outside light to pass through the light guide plate and the light to be incident from the incidence surface of the light guide plate. For this reason, even when an amount of the light to pass through the light guide plate from the other surface-side to one surface-side and to be incident on the display part is reduced, it is possible to suppress the luminance of the light to be emitted from the display part of the reflective display from being lowered.

At least a part of a side surface of the light guide plate may be formed as a reflection part configured to internally reflect the light to be incident from the incidence surface.

With the above configuration, it is possible to internally reflect the light to be incident from the incidence surface on the reflection part and to cause the same to be directed toward the steps. For this reason, as compared to a configuration where at least a part of a side surface of the light guide plate is not formed as the reflection part configured to internally reflect the light to be incident from the incidence surface, it is possible to cause more light to be incident on the display part, so that it is possible to further suppress the luminance of the light to be emitted from the display part of the reflective display from being lowered.

The reflection part may be configured to internally reflect the light to be incident from the incidence surface toward the display part.

With the above configuration, it is possible to internally reflect the light to be incident from the incidence surface on the reflection part and to cause the same to be incident on the display part. For this reason, as compared to a configuration where at least a part of a side surface of the light guide plate is not formed as the reflection part configured to internally reflect the light to be incident from the incidence surface toward the display part, it is possible to cause more light to be incident on the display part, so that it is possible to further suppress the luminance of the light to be emitted from the display part of the reflective display from being lowered.

The steps may be provided with a reflection member.

With the above configuration, since the steps can internally reflect more light toward the display part, as compared to a configuration where the reflection member is not provided, it is possible to further suppress the luminance of the light to be emitted from the display part of the reflective display from being lowered.

The vehicular display device may further include a light-transmittable adhesive layer interposed between the light guide plate and the display part.

With the above configuration, as compared to a configuration where an air layer is interposed between the light guide plate and the display part, it is possible to suppress the light, which is to be incident from the incidence surface and to be internally reflected toward the display part by the steps, from being Fresnel reflected on a surface of the light guide plate facing toward the display part. For this reason, since it is possible to cause more light to be incident on the display part, it is possible to further suppress the luminance of the light to be emitted from the display part of the reflective display from being lowered. Also, it is possible to suppress the light to be emitted from the display part of the reflective display from being Fresnel reflected on a surface of the light guide plate facing toward the display part. For this reason, it is possible to suppress the luminance of the light, which is to be emitted from the display part and to pass through the light guide plate, from being lowered. Therefore, it is possible to suppress the visibility of the information to be displayed on the display part from being lowered.

The plurality of step regions may be regions extending in linear shapes parallel with each other, when the light guide plate is seen from above, and a width of a step region in a width direction may be equal to or larger than 0.1 mm and equal to or smaller than 2.5 mm and may also be smaller than a width between the plurality of step regions.

With the above configuration, it is difficult for a person to recognize the steps, so that it is possible to suppress the information to be displayed on the display part superimposed on the steps from being visually distorted. For this reason, it is possible to suppress the visibility of the information to be displayed on the display part from being lowered due to the steps.

The plurality of step regions may be located between pixels of the display part, when the light guide plate is seen from above.

With the above configuration, since the steps and the pixels of the display part do not overlap each other, it is possible to suppress the information to be displayed on the display part from being visually distorted. For this reason, it is possible to suppress the visibility of the information to be displayed on the display part from being lowered due to the steps.

The plurality of step regions may be regions extending in linear shapes parallel with each other, when the light guide plate is seen from above, and a pitch of the step regions may be obtained by multiplying a natural number by a pitch of pixels of the display part.

With the above configuration, as compared to a configuration where the plurality of step regions does not extend in linear shapes parallel with each other, the productivity of the light guide plate can be improved. Also, it is possible to suppress moire, which is caused when the steps and the information to be displayed on the display part interfere with each other, from being generated. For this reason, it is possible to suppress the visibility of the information to be displayed on the display part from being lowered due to the steps.

The vehicular display device may further include a light source configured to emit light to be incident on the incidence surface.

With the above configuration, since it is possible to display the information on the display part at any time of night or day, the reflective display can be used as a marker lamp such as a stop lamp, a turn signal lamp and the like provided to the vehicle, for example.

The incidence surface may include an incidence surface for light source on which light to be emitted from the light source is to be incident, and an incidence surface for outside light on which light to be emitted from a light source located outside the vehicle is to be incident.

Here, the light to be emitted from the light source located outside the vehicle indicates the outside light that is light to be emitted from a light source located outside the vehicle, such as the sun, a streetlamp and the like. For this reason, with the above configuration, it is possible to display the information on the display part at any time of night or day, and to cause more outside light to be incident on the display part, as compared to a configuration where there is no incidence surface for outside light. For this reason, it is possible to further suppress the luminance of the light to be emitted from the display part of the reflective display from being lowered.

The vehicular display device may further include a housing configured to accommodate therein the reflective display, and the light guide plate may be configured as a part of the housing.

With the above configuration, the reflective display is protected by the housing. Also, since the light guide plate is configured as a part of the housing, it is possible to suppress the number of components from increasing, as compared to a configuration where the light guide plate is not configured as a part of the housing.

The light emission member may be a planar light-emitting member arranged to face the display part, and the planar light-emitting member may have a plurality of light-emitting parts from which light is to be emitted toward the display part, and a transmission part located between the plurality of light-emitting parts and configured to allow the light to be incident from the display part side and the light to be incident from the opposite side to the display part side to pass therethrough.

With the above configuration, the outside light to be incident on the transmission part of the planar light-emitting member can be incident on the display part through the transmission part. Also, the light emitted from the display part and incident on the transmission part of the planar light-emitting member can be emitted from a side of the transmission part opposite to the display part through the transmission part. For this reason, the reflective display can display the information by using the outside light including the sunlight, and can suppress the visibility of the information from being lowered in the environment where the sunlight is irradiated, as compared to the self-luminous display. Also, since the light-emitting part of the planar light-emitting member emits the light toward the display part, the light to be emitted from the light-emitting part can be incident on the display part. For this reason, the reflective display can provide display by using the outside light and the light to be emitted from the light-emitting part. For this reason, even when an amount of the outside light to be incident on the display part through the transmission part is reduced, it is possible to suppress the luminance of the light, which is to be emitted from the display part of the reflective display, from being lowered.

The plurality of light-emitting parts may be configured not to emit light toward the opposite side to the display part side.

With the above configuration, for example, even when the light is emitted from the light-emitting part, it is possible to suppress the visibility of the information to be displayed on the display part from being lowered.

The vehicular display device may further include a light-transmittable adhesive layer interposed between the planar light-emitting member and the display part.

With the above configuration, as compared to a configuration where an air layer is interposed between the planar light-emitting member and the display part, it is possible to suppress the light, which is to be emitted from the light-emitting part of the planar light-emitting member toward the display part, from being Fresnel reflected on a surface of the planar light-emitting member facing toward the display part. For this reason, since it is possible to cause more light to be incident on the display part, it is possible to further suppress the luminance of the light to be emitted from the display part of the reflective display from being lowered. Also, it is possible to suppress the light to be emitted from the display part of the reflective display from being Fresnel reflected on a surface of the planar light-emitting member facing toward the display part. For this reason, it is possible to suppress the luminance of the light, which is to be emitted from the display part and to pass through the transmission part of the planar light-emitting member, from being lowered. Therefore, it is possible to suppress the visibility of the information to be displayed on the display part from being lowered.

The plurality of light-emitting parts may extend in linear shapes parallel with each other, when the planar light-emitting member is seen from above, from the opposite side to the display part side, and a width of a light-emitting part in a width direction may be equal to or larger than 0.1 mm and equal to or smaller than 2.5 mm and may be smaller than a width between the plurality of light-emitting parts.

With the above configuration, it is difficult for a person to recognize the light-emitting part, so that it is possible to suppress a situation as if the information to be displayed on the display part superimposed on the light-emitting part is deficient. For this reason, it is possible to suppress the visibility of the information to be displayed on the display part from being lowered due to the light-emitting part.

The plurality of light-emitting parts may be located between pixels of the display part, when the planar light-emitting member is seen from above, from the opposite side to the display part side.

With the above configuration, since the light-emitting part and the pixels of the display part do not overlap each other, it is possible to suppress a situation as if the information to be displayed on the display part is deficient. For this reason, it is possible to suppress the visibility of the information to be displayed on the display part from being lowered due to the light-emitting part.

The plurality of light-emitting parts may extend in linear shapes parallel with each other, when the planar light-emitting member is seen from the opposite side to the display part side, and a pitch of the light-emitting parts may be obtained by multiplying a natural number multiple by a pitch of pixels of the display part.

With the above configuration, it is possible to suppress moire, which is caused when the light-emitting part and the information to be displayed on the reflective display interfere with each other, from being generated. For this reason, it is possible to suppress the visibility of the information to be displayed on the display part from being lowered due to the light-emitting part.

A vehicular display device includes a reflective display configured to provide display toward an outside of a vehicle.

A part of light to be emitted from a light source of a lamp unit configured to emit light toward the outside of the vehicle is to be incident on a display part of the reflective display.

In the vehicular display device, since the reflective display is configured to provide display toward an outside of the vehicle, the outside light, which is light from a light source such as the sun, a streetlamp and the like located outside the vehicle, can be incident on the display part of the reflective display. For this reason, the reflective display can display the information by using the outside light including the sunlight, and can suppress the visibility of the information from being lowered in the environment where the sunlight is irradiated, as compared to the self-luminous display. In the meantime, in a dark environment such as night-time, an amount of the light to be incident on the display part is reduced, as compared to an environment where the sunlight is irradiated. In such an environment, a lamp is generally turned on, so that the light is emitted from a light source of a lamp unit of the lamp. In this case, according to the vehicular display device, since a part of the light to be emitted from the light source of the lamp unit is incident on the display part, the reflective display can provide display by using the part of the light to be emitted from the light source of the lamp unit. For this reason, even when an amount of the light to be incident on the display part is reduced, the lamp is turned on, so that it is possible to suppress the luminance of the light, which is to be emitted from the display part of the reflective display, from being lowered. In this way, according to the vehicular display device, it is possible to suppress the visibility of the information to be displayed from being lowered. In the meantime, as the lamp unit, a lamp unit such as a headlight configured to be turned on in the environment such as night-time may be exemplified.

The vehicular display device may further include a reflection member configured to reflect a part of the light to be emitted from the light source and to cause the part of the light to be incident on the display part.

With the above configuration, since it is possible to guide a part of the light to be emitted from the light source of the lamp unit to a desired position, it is possible to improve the degree of design freedom of arrangement and direction of the reflective display with respect to the light source of the lamp unit, as compared to a configuration where the reflection member is not provided.

The vehicular display device may further include a light guide member having an incidence surface, on which a part of the light to be emitted from the light source is to be incident, and an emission surface configured to emit the light toward the display part, which is to be incident from the incidence surface.

With the above configuration, since it is possible to guide a part of the light to be emitted from the light source of the lamp unit to a desired position, it is possible to improve a degree of design freedom of arrangement and direction of the reflective display with respect to the light source of the lamp unit, as compared to a configuration where the light guide member is not provided. Also, as compared to a configuration where the light guide member is not provided, the reflective display can be arranged with being spaced from the light source of the lamp unit.

The vehicular display device may further include a light shielding member arranged between the light source and the reflective display, and the light shielding member may be configured to block at least a part of light of the light to be emitted from the light source, which is different from the light to be incident on the display part.

In the meantime, when the light shielding member is not arranged between the light source and the reflective display, light, which is different from the light to be incident on the display part, of the light to be emitted from the light source of the lamp unit toward the reflective display may be incident on the display part. In this case, the light, which is different from the light to be incident on the display part, may be reflected on the display surface of the display part, so that a person outside the vehicle may be dazzled. However, according to the vehicular display device, it is possible to suppress the light from being incident on the display part by the light shielding member, so that it is possible to suppress the person outside the vehicle from being dazzled. Therefore, it is possible to suppress the visibility of the information to be displayed on the display part from being lowered.

The vehicular display device may further include the lamp unit. The lamp unit includes a reflector configured to reflect a part of the light to be emitted from the light source and having an opening formed at a part thereof, and the reflective display may be arranged so that other part of the light to be emitted from the light source is to be incident on the display part through the opening of the reflector.

With the above configuration, even when an optical member such as a reflection member, a light guide member and the like configured to guide a part of the light to be emitted from the light source of the lamp unit to the display part is not provided, it is possible to cause a part of the light to be emitted from the light source of the lamp unit to be incident on the display part through the opening of the reflector. For this reason, as compared to a configuration where the optical member is provided, it is possible to suppress the number of components from increasing.

The light source may be configured to emit white light.

With the above configuration, the reflective display can provide RGB color display.

The vehicular display device may further include an auxiliary light source configured to emit light to be incident on the display part.

With the above configuration, even when the light from the light source of the lamp unit is not emitted in the dark environment such as night-time, the light to be emitted from the auxiliary light source is incident on the display part, so that the reflective display can display the information. For this reason, the reflective display can be used as a marker lamp such as a vehicle width lamp, a turn signal lamp and the like provided to the vehicle.

As described above, according to the present disclosure, it is possible to provide the vehicular display device capable of suppressing the visibility of the information to be displayed from being lowered.

BRIEF DESCRIPTION OF DRAWINGS

Exemplary embodiments of the present invention will be described in detail based on the following figures, wherein.

DETAILED DESCRIPTION

Hereinafter, exemplary embodiments for implementing the vehicular display device of the present invention will be exemplified together with the accompanying drawings. The exemplary embodiments to be exemplified in the below are provided so as to easily understand the present invention, not to limitedly construe the present invention. The present invention can be changed and modified from the exemplary embodiments without departing from the gist thereof.

First Exemplary Embodiment

Figure 1:
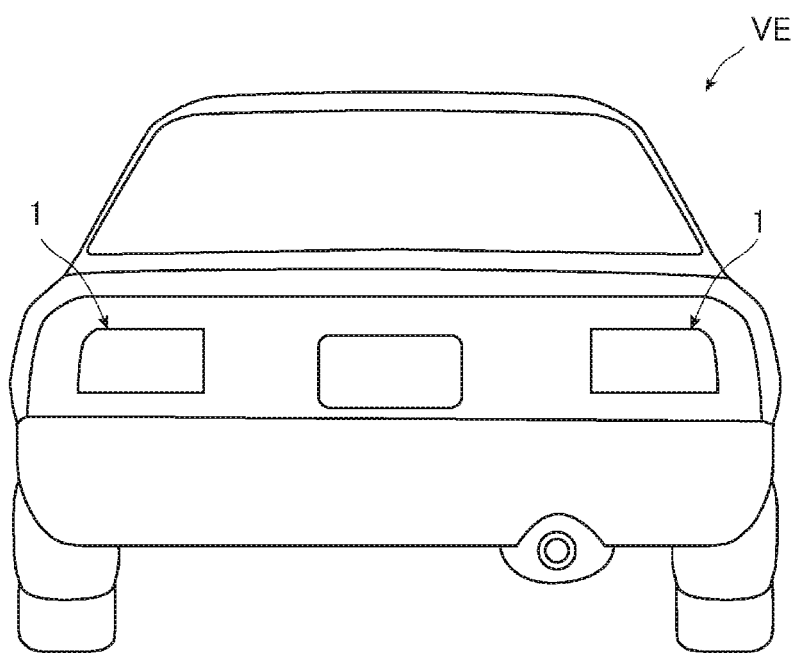
FIG. 1 depicts an example of a vehicle on which a vehicular display device according to a first exemplary embodiment of the present invention is mounted.

FIG. 1 depicts an example of a vehicle on which a vehicular display device according to a first exemplary embodiment of the present invention is mounted. FIG. 1 depicts a vehicle VE, as seen from a rear side. As shown in FIG. 1, the vehicular display device according to the first exemplary embodiment is a marker lamp 1. The marker lamp 1 of the first exemplary embodiment is respectively provided at the left and right sides on a rear surface of the vehicle VE. Each marker lamp 1 is exposed to an outside of the vehicle VE, and is configured to emit light toward the outside of the vehicle VE.

Figure 2:
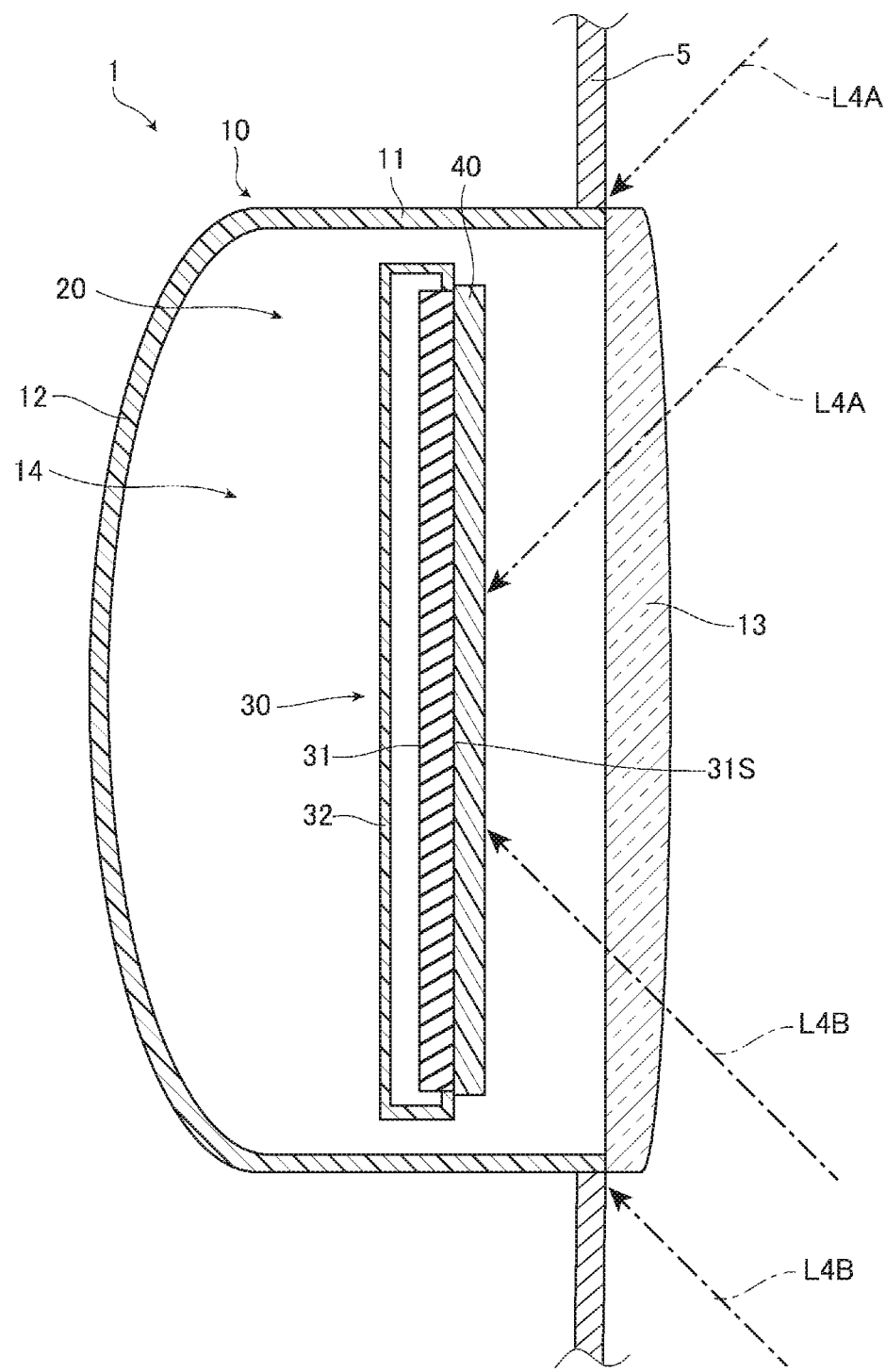
FIG. 2 schematically depicts a vertical section of a marker lamp shown in FIG. 1.
Figure 3:
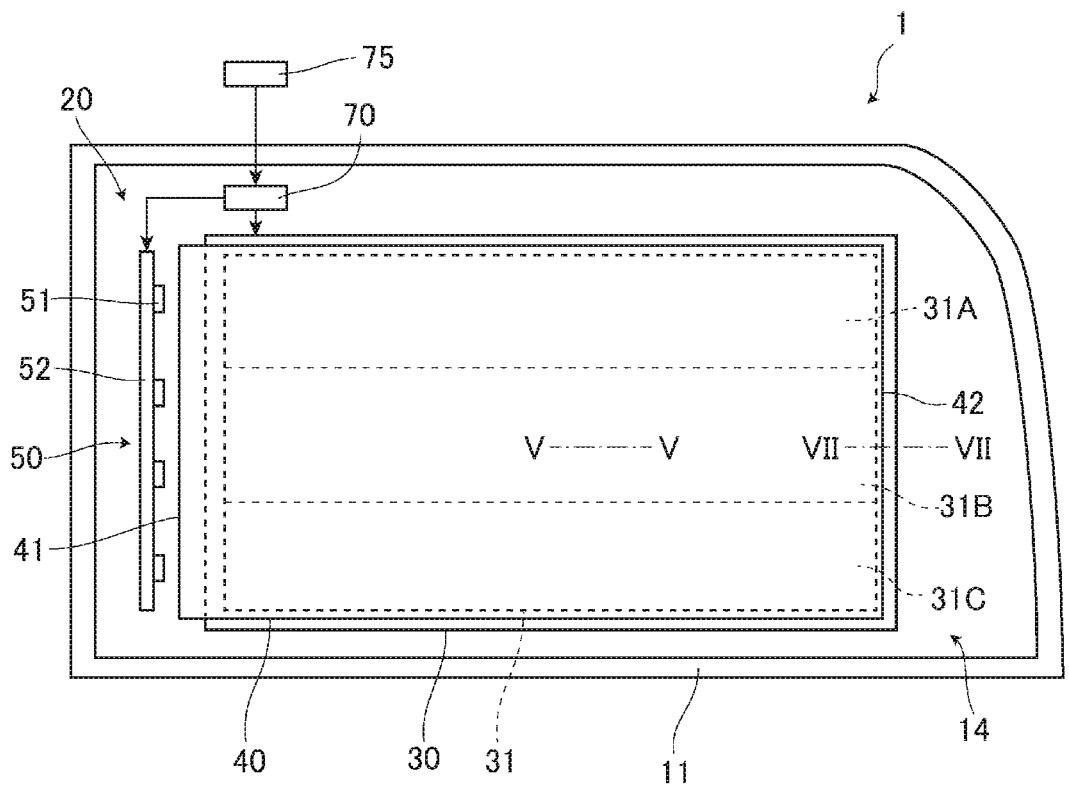
FIG. 3 is a front view of the marker lamp shown in FIG. 1.

FIG. 2 schematically depicts a vertical section of the marker lamp shown in FIG. 1, and FIG. 3 is a front view of the marker lamp shown in FIG. 1. As shown in FIG. 2, the marker lamp 1 of the first exemplary embodiment includes, as main configurations, a housing 10 and a display unit 20.

The housing 10 has a frame body 11, a bottom plate 12, and a cover 13. The frame body 11 is a cylindrical member extending substantially in a horizontal direction toward the outside of the vehicle VE. The bottom plate 12 is connected to an internal end portion of the frame body 11 so as to close an opening of the frame body 11 facing toward an inside of the vehicle VE. The cover 13 is made of a colorless light-transmittable material, and is attached to an external end portion of the frame body 11 so as to close an opening of the frame body 11 facing toward an outside of the vehicle VE. In the housing 10 configured as described above, an internal space 14 surrounded by the frame body 11, the bottom plate 12 and the cover 13 is formed. The housing 10 is fitted in an opening of an outer plate 5, which is a part of an exterior package of the vehicle VE, and is fixed to the outer plate 5 by a means (not shown).

As shown in FIGS. 2 and 3, the display unit 20 of the first exemplary embodiment includes, main configurations, a reflective display 30, a light guide plate 40 as the light emission member, a light source 50, and a control unit 70. The display unit 20 is accommodated in the internal space 14 of the housing 10, and is fixed to the housing 10 by a means (not shown).

Figure 4:
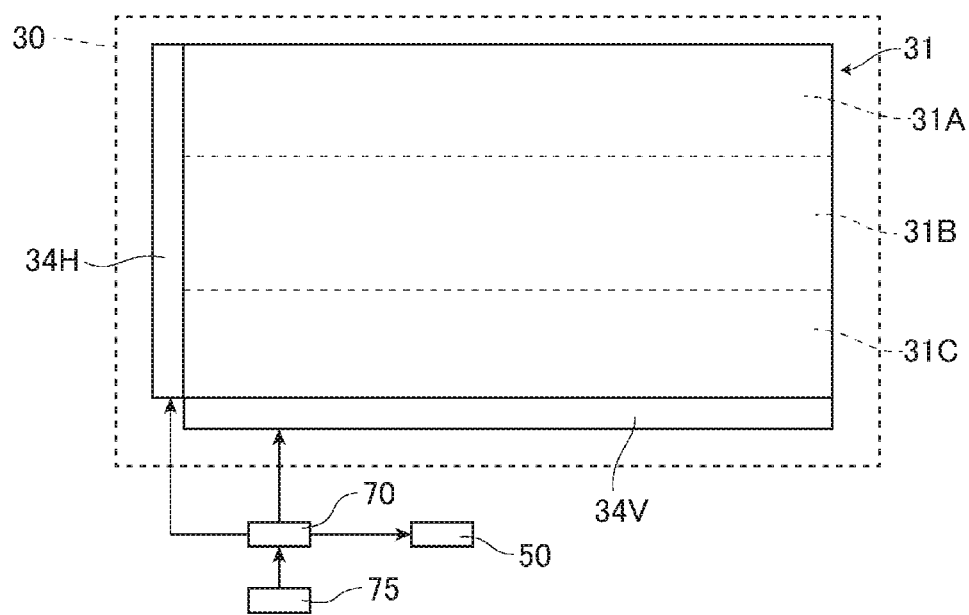
FIG. 4 is a front view of a reflective display.

FIG. 4 is a front view of the reflective display 30. As shown in FIGS. 2 to 4, the reflective display 30 of the first exemplary embodiment includes, main configurations, a display part 31, and an edge part cover 32. In the meantime, in FIG. 2, an interior of the display part 31 is not shown, and in FIG. 4, the edge part cover 32 is not shown. The edge part cover 32 of the first exemplary embodiment is configured to cover an entire periphery of side surfaces and a rear surface of the display part 31. In the meantime, the edge part cover 32 is not particularly limited, and for example, may be configured not to cover the rear surface-side of the display part 31. Also, the reflective display 30 may not have the edge part cover 32.

The reflective display 30 of the first exemplary embodiment is a display configured to reflect light, which is to be incident from a display surface 31S of the display part 31, in the display part 31 and to emit the same from the display surface 31S, thereby providing display, and is configured by a reflective liquid crystal display, for example. The reflective display 30 is arranged so that an outer periphery is to be covered by the frame body 11 of the housing 10 and the display surface 31S of the display part 31 is to face the cover 13. For this reason, the display surface 31S can be visually recognized from the outside of the vehicle VE, through the cover 13 and the opening of the frame body 11 facing toward the outside of the vehicle VE, and the reflective display 30 is arranged to provide display toward the outside of the vehicle VE.

The display part 31 has a rectangular outer shape, and a plurality of pixels arranged in a matrix shape is provided in the rectangular outer shape. Each pixel includes a dot for red display configured to reflect incident light and to emit red light, a dot for green display configured to reflect incident light and to emit green light, and a dot for blue display configured to reflect incident light and to emit blue light. Therefore, in the first exemplary embodiment, the reflective display 30 can provide RGB color display. Also, as shown in FIG. 4, a scanning line drive circuit 34H is disposed at a lateral side of the display part 31, and a data line drive circuit 34V is disposed at one side of the display part 31 in an upper and lower direction. The scanning line drive circuit 34H and the data line drive circuit 34V are electrically connected to each dot for display of each pixel. A voltage is applied from the scanning line drive circuit 34H and the data line drive circuit 34V to each dot for display, so that reflection and non-reflection states of light to be incident on each dot for display of RGB and an amount of light to be reflected are controlled. That is, emission and non-emission states of the light from each dot for display of RGB and an amount of light to be emitted are controlled.

Also, the display part 31 of the first exemplary embodiment is configured so that a plurality of divided regions is to be individually turned on. Specifically, the display part 31 is divided into a stop lamp region 31A, a turn signal lamp region 31B, and a rear lamp region 31C in corresponding order from above. The stop lamp region 31A is a region that is to be turned in red when a brake of the vehicle VE is operated. The turn signal lamp region 31B is a region that is to be turned in orange when a direction indicator of the vehicle VE is operated. The rear lamp region 31C is a region that is to be turned in white when a rear gear of the vehicle VE is operated. For this reason, the pixels of the stop lamp region 31A may include a dot for red display for emitting red light, and may not include a dot for green display for emitting green light and a dot for blue display for emitting blue light. Also, the pixels of the turn signal lamp region 31B may include a dot for red display for emitting red light and a dot for green display for emitting green light, and may not include a dot for blue display for emitting blue light.

The light guide plate 40 is a plate-shaped member made of a clear light-transmittable resin, for example. As shown in FIG. 3, the light guide plate 40 of the first exemplary embodiment has a rectangular outer shape, and one surface is arranged to face the display surface 31S of the display part 31 of the reflective display 30. The light guide plate 40 is configured to cover the entire display surface 31S of the display part 31, when the light guide plate 40 is seen from above. One side surface of the light guide plate 40 in the right and left direction is formed as an incidence surface 41 on which the light to be emitted from the light source 50 is to be incident. For this reason, the light emitted from the light source 50 and incident on the incidence surface 41 is propagated in the light guide plate 40 from the incidence surface 41 toward a side surface opposite to the incidence surface 41.

Figure 5:
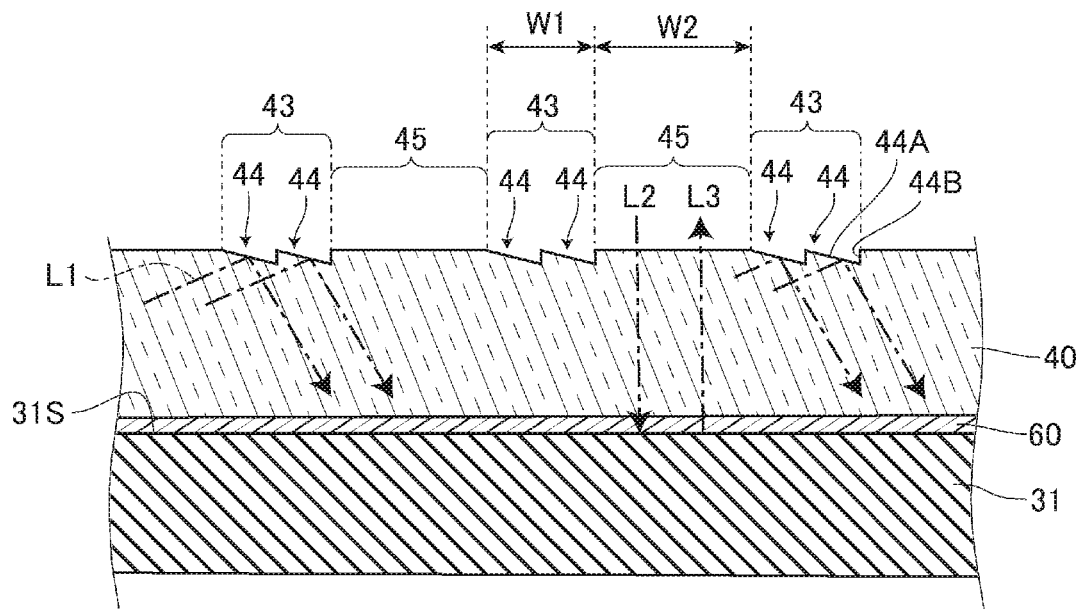
FIG. 5 is a sectional view of a display unit taken along a line V-V of FIG. 3.

FIG. 5 is a sectional view of the display unit 20 taken along a line V-V of FIG. 3, i.e., a sectional view of the display unit 20 substantially perpendicular to the incidence surface 41 and the display surface 31S. In the meantime, in FIG. 5, an interior of the display part 31 of the reflective display 30 and the edge part cover 32 are not shown. As shown in FIG. 5, a surface of the light guide plate 40 opposite to the display part 31 is provided with a plurality of step regions 43 in which steps 44 are formed, and a planar region 45 located between the step regions 43.

The step 44 is a depression in which the surface of the light guide plate 40 opposite to the display part 31 is concave toward the display part 31. The step 44 of the first exemplary embodiment has an inclined surface 44A and a connection surface 44B. The inclined surface 44A is a surface inclined toward the display part 31 from the incidence surface 41-side toward the opposite side to the incidence surface 41-side in a direction perpendicular to the incidence surface 41. The connection surface 44B is a surface that connects to an end of the inclined surface 44A at an opposite side to the incidence surface 41-side and is substantially parallel with a thickness direction of the light guide plate 40. Also, when the light guide plate 40 is seen from above, the step 44 extends linearly from one edge to the other edge in the upper and lower direction, and two steps 44 are formed in parallel without a gap in one step region 43. For this reason, the plurality of step regions 43 is regions extending in linear shapes parallel with each other and is substantially parallel with the incidence surface 41, when the light guide plate 40 is seen from above. For this reason, a part of light L1 incident from the incidence surface 41 and propagated in the light guide plate 40 is internally reflect on the inclined surface 44A of the step 44 toward the display part 31. In the meantime, as described above, since the planar region 45 is planar, a part of light L2 to be incident on the planar region 45 is emitted from a surface of the display part 31 side through the light guide plate 40. Also, a part of light L3 to be incident on the surface of the display part 31 side is emitted from the planar region 45 through the light guide plate 40. For this reason, it can be understood that the light guide plate 40 allows the light L3 to be incident from the display part 31 side and the light L2 to be incident from the opposite side to the display part 31 side to pass therethrough, and emits the light L1 to be incident from the incidence surface 41, which is different from the light L3 to be incident from the display part 31 side and the light L2 to be incident from the opposite side to the display part 31 side, toward the display part 31. In the meantime, as described above, when the light guide plate 40 is seen from above, the plurality of step regions 43 is regions extending in linear shapes parallel with each other, and the planar region 45 is located between the step regions 43. For this reason, when the light guide plate 40 is seen from above, the planar region 45 is a region extending in a linear shape, like the step region 43. In the meantime, in the first exemplary embodiment, a width W1 in a width direction of the step region 43 is smaller than a width W2 between the step regions 43. The width W2 between the step regions 43 is a width of the planar region 45 in the width direction of the step region 43.

Figure 6:
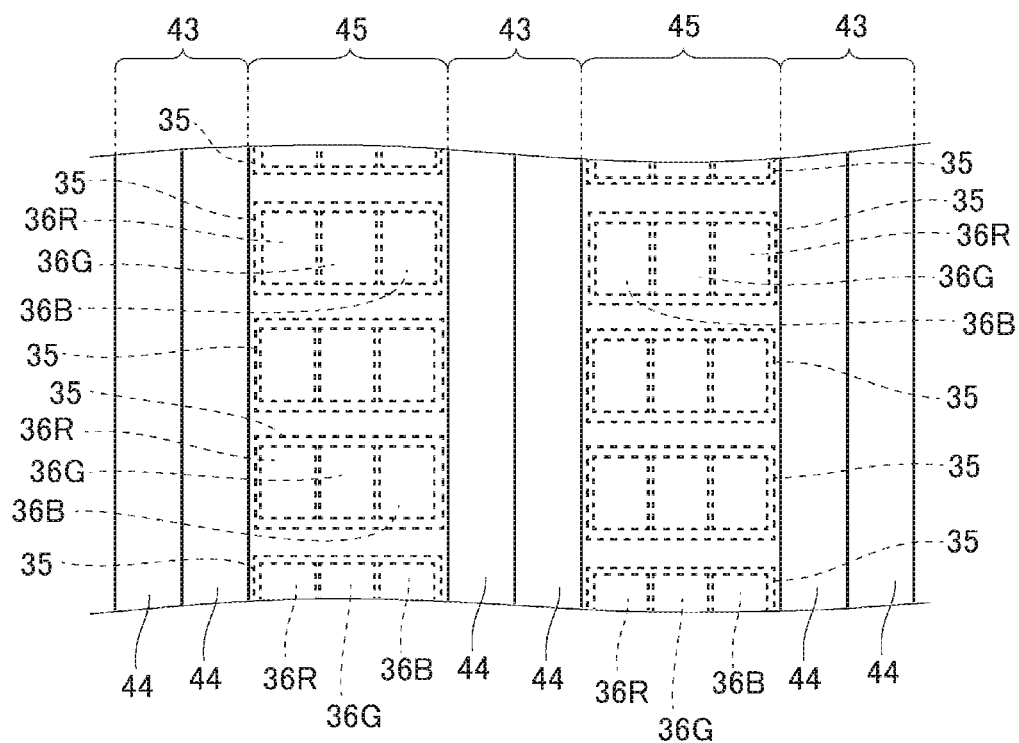
FIG. 6 is a partially enlarged view of FIG. 3, illustrating arrangement of step regions.

FIG. 6 is a partially enlarged view of FIG. 3, illustrating arrangement of the step regions. As shown in FIG. 6, when the light guide plate 40 is seen from above, the step region 43 is located between the pixels 35 of the display part 31, each of which includes a dot for red display 36R, a dot for green display 36G and a dot for blue display 36B. For this reason, when the light guide plate 40 is seen from above, the step region 43 does not overlap the pixels 35 of the display part 31. In the meantime, in the first exemplary embodiment, one step region 43 is located between the pixels 35 in the right and left direction. In other words, a pitch of the step regions 43 is the same as a pitch of the pixels 35 in the right and left direction, and the pixels 35 are located in the planar region 45.

Figure 7:
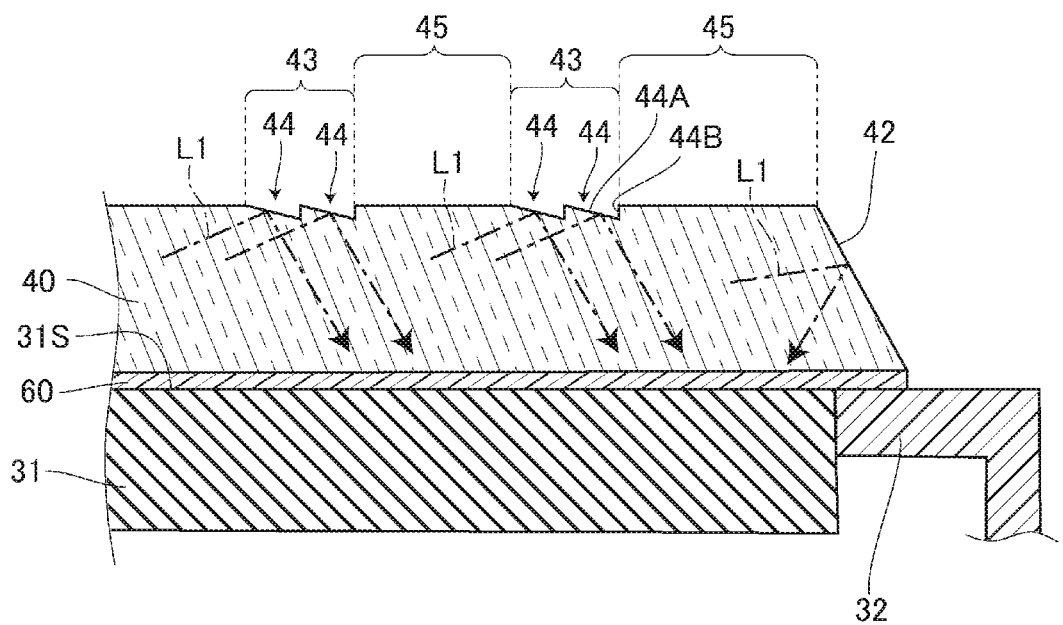
FIG. 7 is a sectional view of the display unit taken along a line VII-VII of FIG. 3.

FIG. 7 is a sectional view of the display unit taken along a line VII-VII of FIG. 3, i.e., a sectional view of the display unit 20 traversing the other side surface in the right and left direction of the light guide plate 40 facing the incidence surface 41. As shown in FIG. 7, the other side surface in the right and left direction of the light guide plate 40 facing the incidence surface 41 is formed as a reflection part 42 inclined toward the display part 31 from the incidence surface 41-side toward the opposite side to the incidence surface 41-side in the direction perpendicular to the incidence surface 41. For this reason, a part of the light L1 that is to be incident from the incidence surface 41 and to be propagated in the light guide plate 40 is internally reflect on the reflection part 42 toward the display part 31. That is, the reflection part 42 is configured to internally reflect a part of the light L1 to be incident from the incidence surface.

The light guide plate 40 is bonded to the reflective display 30. Specifically, as shown in FIGS. 5 and 7, one surface of the light guide plate 40 is bonded to the display part 31 by a light-transmittable adhesive layer 60 arranged between the light guide plate 40 and the display part 31. That is, the adhesive layer 60 is an adhesive layer for bonding the light guide plate 40 and the display part 31 each other with being interposed between the light guide plate 40 and the display part 31. In the first exemplary embodiment, the adhesive layer 60 is interposed between the light guide plate 40 and the edge part cover 32, too, so that the light guide plate 40 is bonded to the edge part cover 32, too. Also, the adhesive layer 60 is colorless and light-transmittable, and covers the display surface 31S of the display part 31 of the reflective display 30. For this reason, a part of the light to be emitted from a surface of the light guide plate 40 facing toward the display part 31 is incident on the display part 31 through the adhesive layer 60. Also, a part of the light to be emitted from the display surface 31S of the display part 31 is incident on the light guide plate 40 through the adhesive layer 60, and is emitted from the planar region 45 through the light guide plate 40. In the meantime, a refractive index of the adhesive layer 60 of the first exemplary embodiment is set to a value between a refractive index of the light guide plate 40 and a refractive index of the member configuring the display surface 31S of the display part 31. The adhesive layer 60 is not particularly limited inasmuch as it is light-transmittable and can bond the light guide plate 40 and the reflective display 30 each other. As a material of the adhesive layer 60, a thermoplastic resin, a thermosetting resin, a photo-curable resin and the like may be exemplified.

In the meantime, as described above, the reflective display 30 is arranged so that the display surface 31S of the display part 31 is to face the cover 13, the light guide plate 40 covers the display surface 31S, and the adhesive layer 60 is interposed between the display surface 31S and the light guide plate 40. Also, the cover 13, the light guide plate 40, and the adhesive layer 60 are light-transmittable. For this reason, the display surface 31S of the display part 31 of the reflective display 30 can be visually recognized from the outside of the vehicle VE, through the cover 13, the opening of the frame body 11 facing toward the outside of the vehicle VE, the light guide plate 40, and the adhesive layer 60. That is, the reflective display 30 is arranged so as to provide display toward the outside of the vehicle VE, and the outside light, which is light from a light source such as the sun and a streetlamp located outside the vehicle VE, is incident on the display surface 31S of the display part 31 of the reflective display 30. Specifically, as shown in FIG. 2, the outside light L4A directed obliquely toward the display surface 31S from the upper, such as the sunlight and light of a streetlamp, the outside light L4B directed obliquely toward the display surface 31S from the lower, such as the sunlight and light of a streetlamp reflected on a road surface and the like, and the like are incident on the display surface 31S through the cover 13, the light guide plate 40, and the adhesive layer 60. In the meantime, as described above, the outer periphery of the reflective display 30 is covered by the frame body 11 of the housing 10 fitted in the opening of the outer plate 5 of the vehicle VE. For this reason, a part of the outside lights L4A, L4B directed toward the display surface 31S may be blocked by the outer plate 5 and the frame body 11 of the housing 10, so that it may not be incident on the display part 31.

The light source 50 shown in FIG. 3 includes light-emitting elements 51 mounted on a circuit substrate 52, and the light-emitting elements 51 are arranged to face the incidence surface 41 of the light guide plate 40. The power is fed to the light-emitting elements 51 via the circuit substrate 52, so that light is emitted from the light-emitting elements 51. The light-emitting elements 51 of the first exemplary embodiment are an LED array consisting of a plurality of LEDs aligned in the upper and lower direction along the incidence surface 41 of the light guide plate 40, and white light is emitted from the LED array. In the meantime, the light source 50 is not particularly limited inasmuch as it can cause the light to be incident on the incidence surface 41 of the light guide plate 40.

As shown in FIG. 4, the control unit 70 is electrically connected to the scanning line drive circuit 34H and the data line drive circuit 34V of the display part 31 and the light source 50, and is configured to control light emission and non-emission states of each pixel 35 of the display part 31 and light emission and non-emission states of the light source 50. The control unit 70 is configured to perform the control, based on a signal to be input from an outside to the control unit 70. In the first exemplary embodiment, the control unit 70 is electrically connected to a control device 75 of the vehicle VE, and the like.

Subsequently, operations of the display unit 20 are described.

In the below, a case where the stop lamp region 31A is turned on is exemplified, and descriptions of cases where the turn signal lamp region 31B is blinked and the rear lamp region 31C is turned on are omitted. In a case of an input state where a signal indicative of a brake operation from the control device 75 of the vehicle VE is detected and the signal indicative of the brake operation is input to the control unit, the control unit 70 controls the display part 31 and the light source 50 to turn on the stop lamp region 31A of the display part 31. Specifically, the control unit 70 controls the light source 50 to cause the light emitted from the light source 50 to be incident on the incidence surface 41 of the light guide plate 40. As described above, a part of the light incident on the incidence surface 41 of the light guide plate 40 is propagated along the light guide plate 40, is internally reflect toward the display part 31 by the steps 44, and is incident on the display surface 31S of the display part 31 through the adhesive layer 60. In the meantime, an angle of the inclined surface 44A of the step 44 is set so that at least a part of the internally reflected light is to be incident on the display part 31 located in the planar region 45. Also, the control unit 70 drives the scanning line drive circuit 34H and the data line drive circuit 34V. The scanning line drive circuit 34H and the data line drive circuit 34V adjust the applied voltage to adjust the light emission states of the dot for red display 36R, the dot for green display 36G and the dot for blue display 36B of each pixel 35 of the display part 31. Specifically, the scanning line drive circuit 34H and the data line drive circuit 34V adjust the dot for red display 36R of each pixel 35 of the stop lamp region 31A to a state where the incident light is to be reflected and the light is to be emitted. On the other hand, each dot for display of the other pixels 35 is adjusted to a state where the light is not to be emitted. For this reason, as described above, the light emitted from the light source 50 and incident on the display surface 31S of the display part 31 is emitted from the dot for red display 36R of each pixel 35 of the stop lamp region 31A adjusted to the state where the incident light is to be reflected and the light is to be emitted. Also, as described above, the outside light, which is the light from the light source such as the sun and a streetlamp located outside the vehicle VE, is also incident on the display surface 31S of the display part 31 of the reflective display 30. For this reason, the light incident on the display surface 31S is emitted from the dot for red display 36R of each pixel 35 of the stop lamp region 31A adjusted to the state where the incident light is to be reflected and the light is to be emitted, like the light that is to be emitted from the light source 50 and to be incident on the display surface 31S. In this way, the light emitted from the light source 50 and the outside light are emitted from the dot for red display 36R of each pixel 35 of the stop lamp region 31A, so that the stop lamp region 31A is turned on and information, which indicates that a brake has been operated, is displayed by the marker lamp 1.

As described above, the marker lamp 1 that is the vehicular display device of the first exemplary embodiment includes the reflective display 30 configured to provide display toward the outside of the vehicle VE, and the light guide plate 40 as the light emission member arranged to face the display part 31 of the reflective display 30. The light guide plate 40 has one surface arranged to face the display part 31, and the incidence surface 41 on which the light, which is different from the lights to be incident from one surface and the other surface, is to be incident. The other surface of the light guide plate 40 has the plurality of step regions 43, in each of which the steps 44 configured to internally reflect the light to be incident from the incidence surface 41 toward the display part 31 are formed, and the planar region 45 located between the step regions 43.

For this reason, the light to be incident from the planar region 45 on the other surface of the light guide plate 40 can be incident on the display part 31 through the light guide plate 40. Also, the light to be emitted from the display part 31 and to be incident on one surface of the light guide plate 40 can be emitted from the planar region 45 on the other surface of the light guide plate 40 through the light guide plate 40. For this reason, the reflective display 30 can display the information by using the outside light including the sunlight, and can suppress the visibility of the information from being lowered in the environment where the sunlight is irradiated, as compared to the self-luminous display. Also, since the light guide plate 40 is configured to internally reflect the light to be incident from the incidence surface 41 toward the display part 31 by the steps 44, the light to be incident from the incidence surface 41 can be emitted from one surface of the light guide plate 40 and can be incident on the display part 31. For this reason, the reflective display 30 can provide display by using the outside light to pass through the light guide plate 40 and the light to be incident from the incidence surface 41 of the light guide plate 40. For this reason, even when an amount of the light to be incident on the display part 31 from the other surface toward one surface through the light guide plate 40 is reduced, it is possible to suppress the luminance of the light to be emitted from the display part 31 of the reflective display 30 from being lowered. In this way, according to the marker lamp 1 of the first exemplary embodiment, it is possible to suppress the visibility of the information to be displayed from being lowered.

In the first exemplary embodiment, the other side surface in the right and left direction of the light guide plate 40 opposite to the incidence surface 41 is formed as the reflection part 42 configured to internally reflect the light to be incident from the incidence surface 41, so that the reflection part 42 internally reflects the light to be incident from the incidence surface 41 toward the display part 31. For this reason, it is possible to internally reflect the light, which is to be incident from the incidence surface 41, on the reflection part 42 and to cause the same to be incident on the display part 31. For this reason, as compared to a configuration where at least a part of a side surface of the light guide plate 40 is not formed as the reflection part configured to internally reflect the light to be incident from the incidence surface 41 toward the display part 31, it is possible to cause more light to be incident on the display part 31, so that it is possible to further suppress the luminance of the light to be emitted from the display part 31 of the reflective display 30 from being lowered. In the meantime, at least a part of a side surface of the light guide plate 40 may be formed as the reflection part 42. For example, a side surface in the upper and lower direction may be formed as the reflection part 42. However, when the light guide plate 40 is seen from above, a side surface that is not parallel with a propagation direction of the light to be incident from the incidence surface 41 is preferably formed as the reflection part.

In the first exemplary embodiment, the marker lamp 1 has the light-transmittable adhesive layer 60 interposed between the light guide plate 40 and the display part 31. For this reason, as compared to a configuration where an air layer is interposed between the light guide plate 40 and the display part 31, it is possible to suppress the light, which is to be incident from the incidence surface 41 and to be internally reflected toward the display part 31 by the steps 44, from being Fresnel reflected on a surface of the light guide plate 40 facing toward the display part 31. For this reason, since it is possible to cause more light to be incident on the display part 31, it is possible to further suppress the luminance of the light to be emitted from the display part 31 of the reflective display 30 from being lowered. Also, it is possible to suppress the light, which is to be emitted from the display part 31 of the reflective display 30, from being Fresnel reflected on the surface of the light guide plate 40 facing toward the display part 31. For this reason, it is possible to suppress the luminance of the light to be emitted from the display part 31 and to pass through the light guide plate 40 from being lowered. Therefore, it is possible to suppress the visibility of the information to be displayed on the display part 31 from being lowered.

In the first exemplary embodiment, the plurality of step regions 43 is located between the pixels 35 of the display part 31, when the light guide plate 40 is seen from above. For this reason, since the steps 44 and the pixels 35 of the display part 31 do not overlap each other, it is possible to suppress the information to be displayed on the display part 31 from being visually distorted. For this reason, it is possible to suppress the visibility of the information to be displayed on the display part 31 from being lowered due to the steps 44.

In the first exemplary embodiment, when the light guide plate 40 is seen from above, the plurality of step regions 43 is the regions extending in linear shapes parallel with each other, and the pitch of the step regions 43 is the same as the pitch of the pixels 35 of the display part 31. For this reason, as compared to a configuration where the plurality of step regions 43 does not extend in linear shapes parallel with each other, the productivity of the light guide plate 40 can be improved. Also, it is possible to suppress moire, which is caused when the steps 44 and the information to be displayed on the display part 31 interfere with each other, from being generated. For this reason, it is possible to suppress the visibility of the information to be displayed on the display part 31 from being lowered due to the steps 44.

In the meantime, from a standpoint of suppressing the visibility of the information to be displayed on the display part 31 from being lowered, when the light guide plate 40 is seen from above. it is preferable that the plurality of step regions 43 is the regions extending in linear shapes parallel with each other and the width W1 in the width direction of the step region 43 is equal to or larger than 0.1 mm and equal to or smaller than 2.5 mm and is also smaller than the width W2 between the step regions 43. With the above configuration, it is difficult for a person to recognize the steps 44, so that it is possible to suppress the information to be displayed on the display part 31 superimposed on the steps 44 from being visually distorted. For this reason, it is possible to suppress the visibility of the information to be displayed on the display part 31 from being lowered due to the steps 44.

In the first exemplary embodiment, the light source 50 configured to emit the light to be incident on the incidence surface 41 is provided. For this reason, since it is possible to display the information on the display part 31 at any time of night or day, the vehicular display device can function as the marker lamp 1.

Second Exemplary Embodiment

Figure 8:
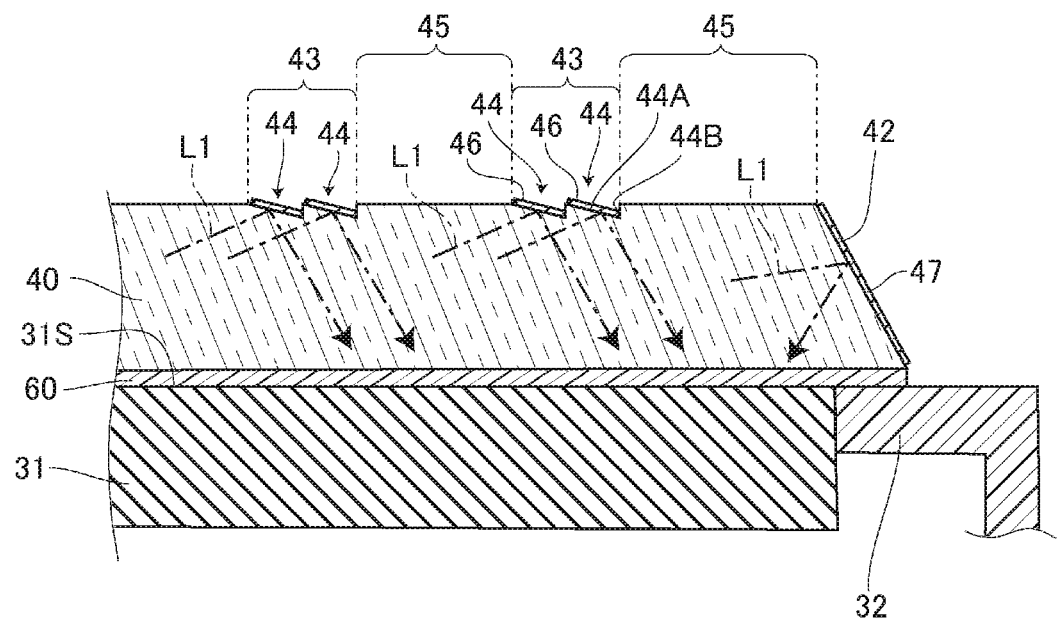
FIG. 8 depicts a display unit according to a second exemplary embodiment of the present invention, in the same manner as FIG. 7.

Subsequently, a second exemplary embodiment of the present invention is described in detail with reference to FIG. 8. FIG. 8 depicts a display unit according to the second exemplary embodiment of the present invention, in the same manner as FIG. 7. In the meantime, the constitutional elements, which are the same as or equivalent to the first exemplary embodiment, are denoted with the same reference numerals and the overlapping descriptions thereof are omitted, unless particularly described.

A display unit 20 of the second exemplary embodiment shown in FIG. 8 is different from the display unit 20 of the first exemplary embodiment, in that a reflection member 46 is provided on the step 44 of the light guide plate 40 and a reflection member 47 is provided on the reflection part 42 of the light guide plate 40.

In the second exemplary embodiment, the reflection member 46 is provided on the inclined surface 44A of the step 44 of the light guide plate 40, and the reflection member 47 is provided on the reflection part 42, which is the other side surface of the light guide plate 40 opposite to the incidence surface 41 in the right and left direction. The reflection members 46, 47 are reflection films formed by metal vapor deposition, for example, respectively. For this reason, as compared to a configuration where the reflection member 46 is not provided, the step 44 can more internally reflect the light L1, which is to be incident from the incidence surface 41 and to be propagated in the light guide plate 40, toward the display part 31. For this reason, it is possible to further suppress the luminance of the light to be emitted from the display part 31 of the reflective display 30 from being lowered. Also, as compared to a configuration where the reflection member 47 is not provided, the reflection part 42 can more internally reflect the light L1, which is to be incident from the incidence surface 41 and to be propagated in the light guide plate 40, toward the display part 31. For this reason, it is possible to further suppress the luminance of the light to be emitted from the display part 31 of the reflective display 30 from being lowered. In the meantime, the reflection members 46, 47 are not limited to the reflection films, and may be configured by metal plates or the like, for example.

Third Exemplary Embodiment

Figure 9:
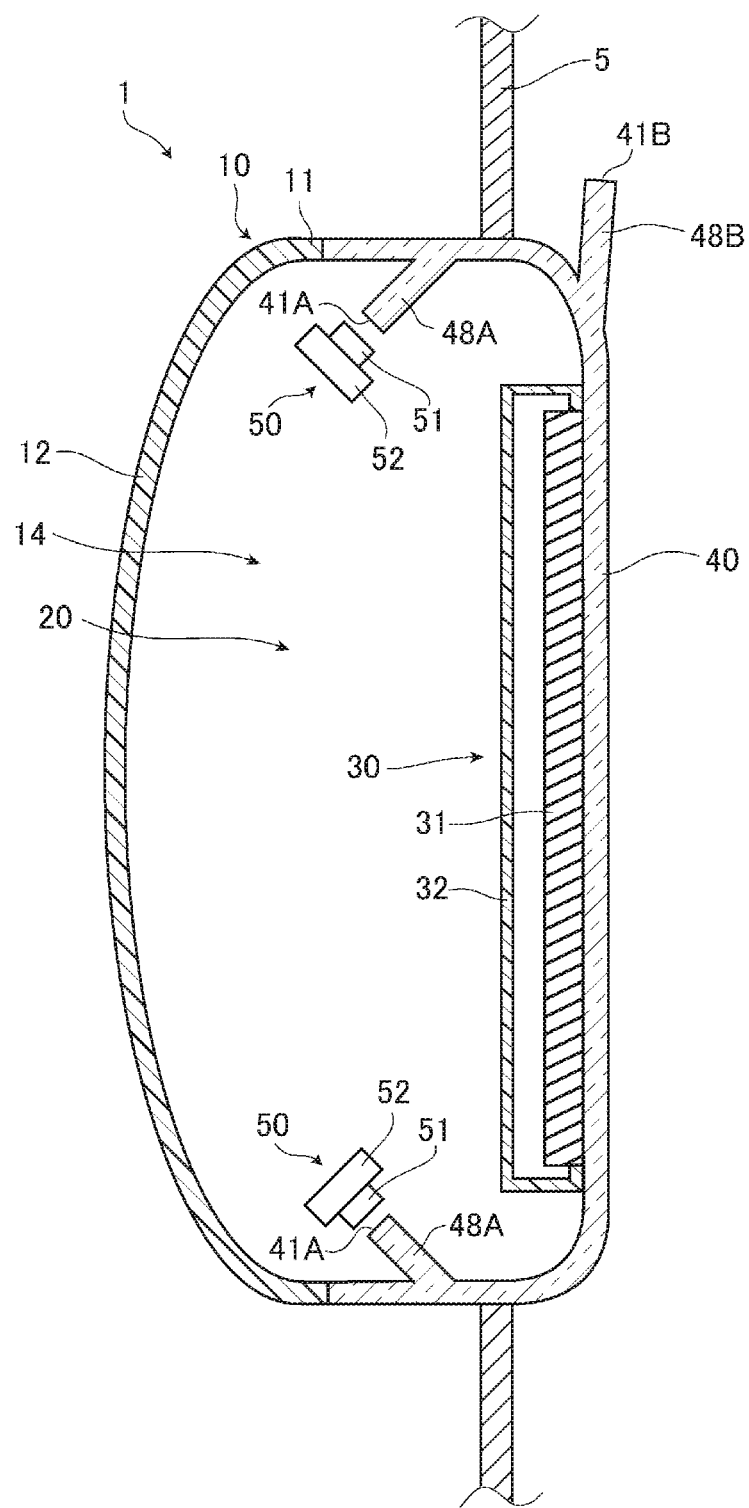
FIG. 9 depicts a marker lamp according to a third exemplary embodiment of the present invention, in the same manner as FIG. 2.
Figure 10:
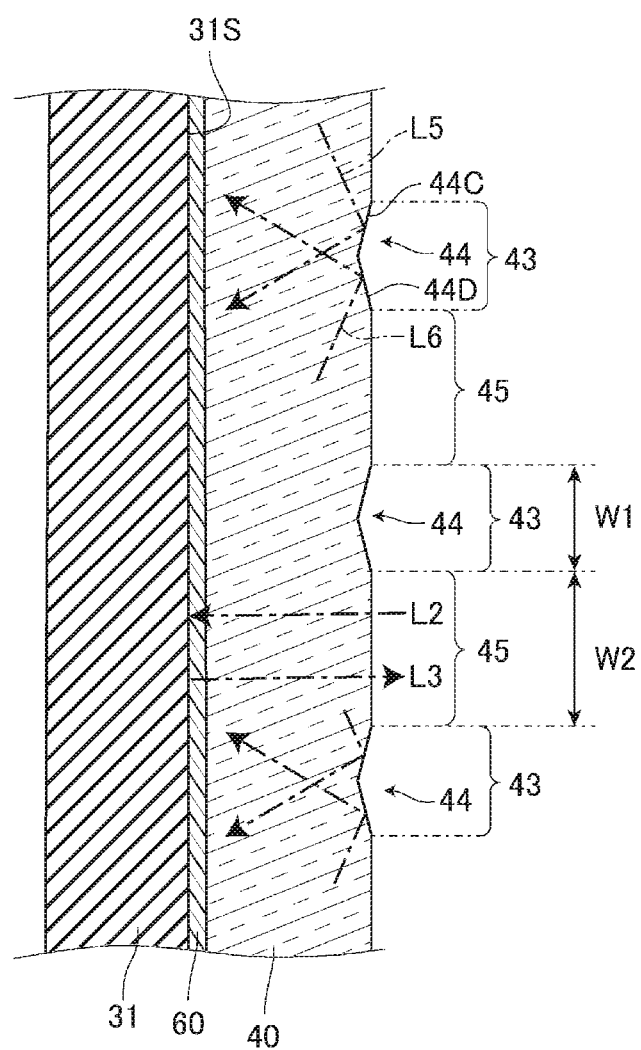
FIG. 10 is a partially enlarged view of FIG. 9.

Subsequently, a third exemplary embodiment of the present invention is described in detail with reference to FIGS. 9 and 10. FIG. 9 depicts a marker lamp according to the third exemplary embodiment of the present invention, in the same manner as FIG. 2, and FIG. 10 is a partially enlarged view of FIG. 9, depicting a vicinity of the light guide plate. In the meantime, the constitutional elements, which are the same as or equivalent to the first exemplary embodiment, are denoted with the same reference numerals and the overlapping descriptions thereof are omitted, unless particularly described.

As shown in FIG. 9, a marker lamp 1 of the third exemplary embodiment is different from the marker lamp 1 of the first exemplary embodiment, in that the housing 10 is not provided with the cover 13, the light guide plate 40 is configured as a part of the housing 10 for accommodating the reflective display 30, and the light guide plate 40 has an incidence surface 41A for a light source and an incidence surface 41B for outside light. Also, as shown in FIG. 10, a shape of a step 44 of the marker lamp 1 of the third exemplary embodiment is different from the step 44 of the first exemplary embodiment.

In the third exemplary embodiment, an entire circumference of an outer periphery of the light guide plate 40 is bent toward the inside of the vehicle VE, and an entire circumference of an end portion of the outer periphery is bonded to an entire circumference of an end portion of the frame body 11 facing toward the outside of the vehicle VE. For this reason, the internal space 14 surrounded by the frame body 11, the bottom plate 12 and the light guide plate 40 is formed, and the reflective display 30 is accommodated in the internal space 14. That is, the light guide plate 40 is formed as a part of the housing 10, instead of the cover 13 of the first exemplary embodiment.

Also, the light guide plate 40 is provided with light guide parts 48A for a light source protruding toward the internal space 14 and a light guide part 48B for outside light protruding toward the outer side and the upper side of the vehicle VE at an upper side of the reflective display 30. An end face of the light guide part 48A for a light source is formed as an incidence surface 41A for a light source, and an end face of the light guide part 48B for outside light is formed as an incidence surface 41B for outside light. The incidence surface 41B for outside light is exposed to the outside of the vehicle VE and is directed upward. For this reason, the outside light to be directed toward the incidence surface 41B for outside light from above can be incident on the incidence surface 41B for outside light. The light incident on the incidence surface 41B for outside light is propagated in the light guide plate 40 from an upper side of the reflective display 30 toward a lower side of the reflective display 30. For this reason, when the light guide plate 40 is seen from above, the outside light that is propagated in the light guide plate 40 is propagated to traverse the display part 31 from the upper side toward the lower side. In the meantime, the incidence surface 41B for outside light has only to be exposed to the outside of the vehicle VE, and a direction of the incidence surface 41B for outside light is not particularly limited. However, from a standpoint of causing the sunlight to be directly incident, the incidence surface 41B for outside light is preferably directed upward.

Also, the light source 50 is arranged to face the incidence surface 41A for a light source. In the third exemplary embodiment, the light guide part 48A for a light source is respectively provided above and below the reflective display 30, and the light source 50 is arranged to face the incidence surface 41A for a light source of each light guide part 48A for a light source. For this reason, the light to be emitted from the light source 50 is incident on each incidence surface 41A for a light source. The light incident on the incidence surface 41A for a light source of the light guide part 48A for a light source provided above the reflective display 30 is propagated in the light guide plate 40 from the upper side of the reflective display 30 toward the lower side of the reflective display 30. For this reason, when the light guide plate 40 is seen from above, the light that is propagated in the light guide plate 40 is propagated to traverse the display part 31 from the upper side toward the lower side. On the other hand, the light incident on the incidence surface 41A for a light source of the light guide part 48A for a light source provided below the reflective display 30 is propagated in the light guide plate 40 from the lower side of the reflective display 30 toward the upper side of the reflective display 30. For this reason, when the light guide plate 40 is seen from above, the light that is propagated in the light guide plate 40 is propagated to traverse the display part 31 from the lower side to the upper side.

Also, as shown in FIG. 10, the step 44 of the third exemplary embodiment has a first inclined surface 44C and a second inclined surface 44D. The first inclined surface 44C is a surface inclined downward from the upper side toward the display part 31. The second inclined surface 44D is a surface that connects to a lower end of the first inclined surface 44C and is inclined downward from the upper side toward an opposite side to the display part 31 side. Also, when the light guide plate 40 is seen from above, the step 44 traverses the display part 31 with extending linearly in the right and left direction, and one step 44 is formed in one step region 43. For this reason, when the light guide plate 40 is seen from above, the plurality of step regions 43 is regions extending in linear shapes parallel with each other. Also, the planar region 45 is provided between the step regions 43. As described above, since the first inclined surface 44C is inclined downward from the upper side toward the display part 31, the light L5 that is propagated in the light guide plate 40 so as to traverse the display part 31 from the upper side toward the lower side is internally reflected toward the display part 31 on the first inclined surface 44C. Also, since the second inclined surface 44D is inclined downward from the upper side toward the opposite side to the display part 31 side, the light L6 that is propagated in the light guide plate 40 so as to traverse the display part 31 from the lower side toward the upper side is internally reflected toward the display part 31 on the second inclined surface 44D. For this reason, parts of the lights L5, L6 are incident on the display part 31 of the reflective display 30. In the meantime, angles of the first inclined surface 44C and the second inclined surface 44D of the step 44 are set so that at least a part of the internally reflected light is to be incident on the display part 31 located in the planar region 45.

In the third exemplary embodiment, as described above, the light guide plate 40 has the incidence surface 41A for a light source on which the light to be emitted from the light source 50 is to be incident and the incidence surface 41B for outside light on which the light to be emitted from the light source 50 located outside the vehicle VE is to be incident. For this reason, since it is possible to display the information on the display part 31 at any time of night or day, the vehicular display device can function as the marker lamp 1. Also, the marker lamp 1 of the third exemplary embodiment can cause more outside light to be incident on the display part 31, as compared to a configuration where the incidence surface 41B for outside light is not provided. For this reason, it is possible to further suppress the luminance of the light, which is to be emitted from the display part 31 of the reflective display 30, from being lowered.

In the third exemplary embodiment, the marker lamp 1 has the housing 10 configured to accommodate therein the reflective display 30, and the light guide plate 40 is configured as a part of the housing 10. For this reason, the reflective display 30 is protected by the housing 10. Also, since the light guide plate 40 is configured as a part of the housing 10, it is possible to suppress the number of components from increasing, as compared to a configuration where the light guide plate 40 is not configured as a part of the housing 10.

Fourth Exemplary Embodiment

Figure 11:
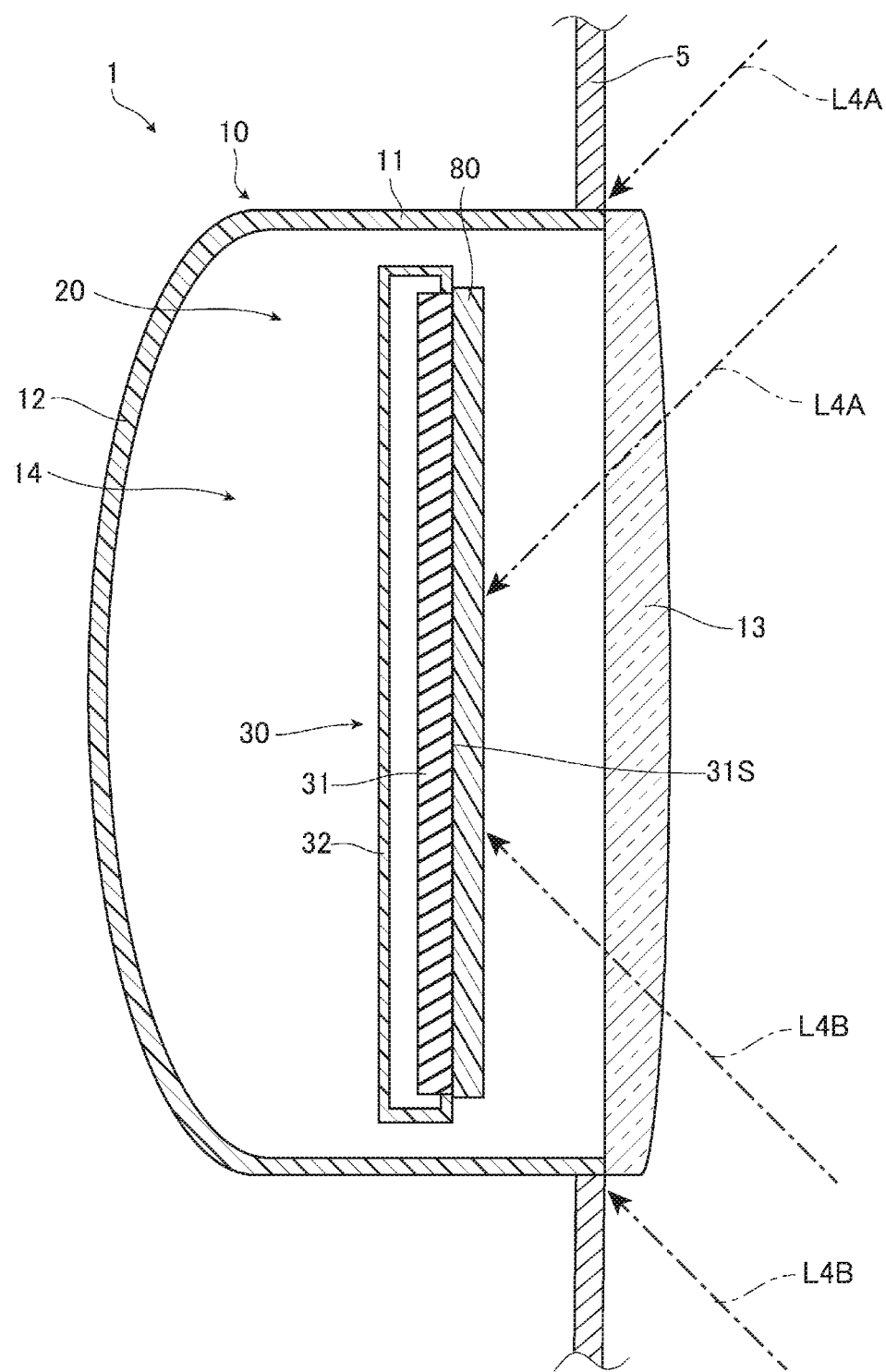
FIG. 11 depicts a marker lamp according to a fourth exemplary embodiment of the present invention, in the same manner as FIG. 2.
Figure 12:
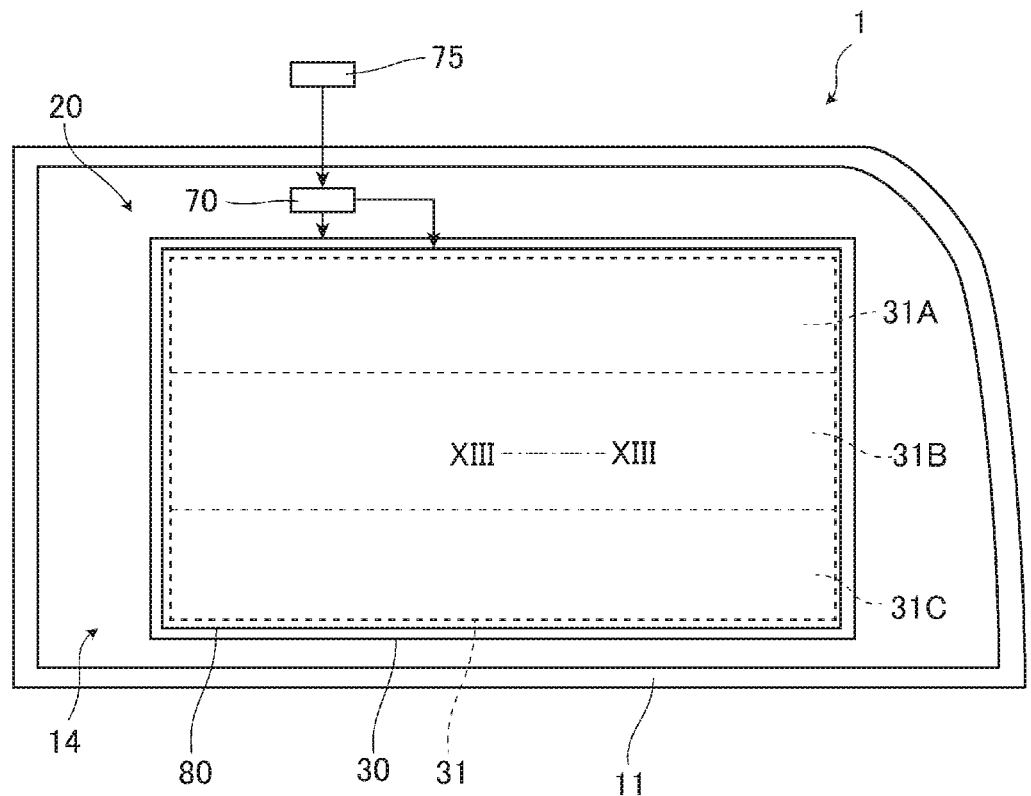
FIG. 12 depicts the marker lamp shown in FIG. 11, in the same manner as FIG. 3.

Subsequently, a fourth exemplary embodiment of the present invention is described in detail with reference to FIGS. 11 and 12. FIG. 11 depicts a marker lamp according to the fourth exemplary embodiment of the present invention, in the same manner as FIG. 2, and FIG. 12 depicts the marker lamp shown in FIG. 11, in the same manner as FIG. 3. In the meantime, the constitutional elements, which are the same as or equivalent to the first exemplary embodiment, are denoted with the same reference numerals and the overlapping descriptions thereof are omitted, unless particularly described.

As shown in FIGS. 11 and 12, a marker lamp 1 of the fourth exemplary embodiment is different from the marker lamp 1 of the first exemplary embodiment, in that the light source 50 is not provided and a planar light-emitting member 80 is provided as the light emission member, instead of the light guide plate 40.

As shown in FIGS. 11 and 12, a display unit 20 of the fourth exemplary embodiment includes, main configurations, the reflective display 30, the planar light-emitting member 80, and the control unit 70, is accommodated in the internal space 14 of the housing 10, and is fixed to the housing 10 by a means (not shown).

The planar light-emitting member 80 of the fourth exemplary embodiment has a rectangular outer shape, and is arranged to face the display surface 31S of the display part 31 of the reflective display 30. When the planar light-emitting member 80 is seen from above, the planar light-emitting member 80 covers the entire display surface 31S of the display part 31.

Figure 13:
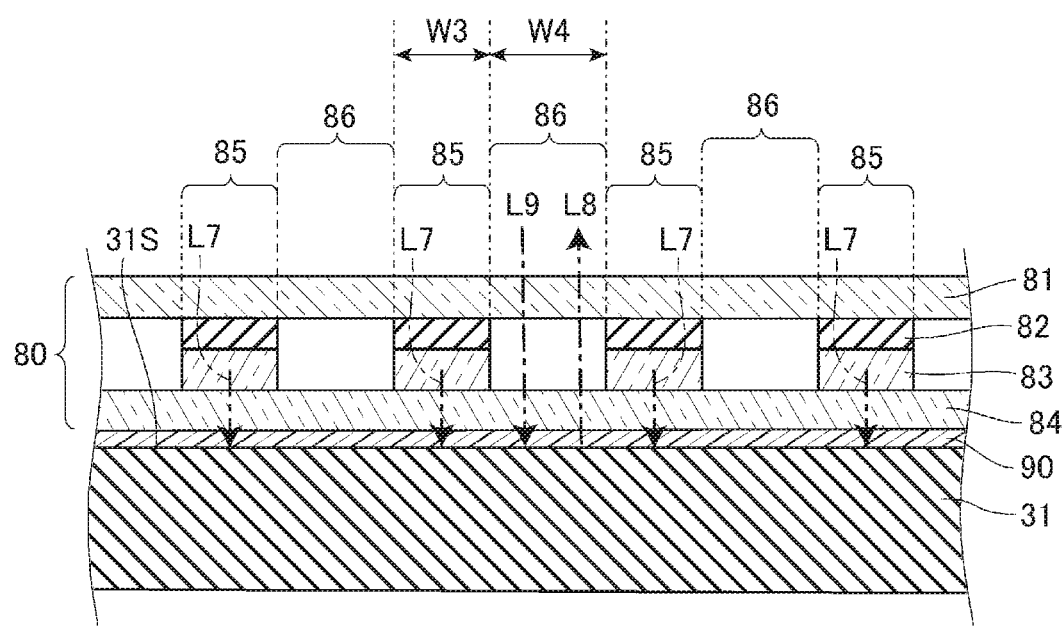
FIG. 13 is a sectional view of the display unit 20 taken along a line VIII-VIII of FIG. 12.

FIG. 13 is a sectional view of the display unit 20 taken along a line VIII-VIII of FIG. 12. In the meantime, in FIG. 13, an interior of the display part 31 of the reflective display 30 and the edge part cover 32 are not shown. As shown in FIG. 13, the planar light-emitting member 80 of the fourth exemplary embodiment includes, main configurations, a light-transmittable substrate 81, reflection electrodes 82, an organic light-emitting diode (OLED) layer 83, and a transparent electrode 84.

The light-transmittable substrate 81 is a substrate on which a circuit to be connected to the control unit 70 is formed, is located at an opposite side to the display part 31 of the reflective display 30, and is a glass substrate, for example. The reflection electrodes 82 are provided with intervals on a mounting surface of the light-transmittable substrate 81. In the fourth exemplary embodiment, the plurality of reflection electrodes 82 extends in linear shapes parallel with each other and traverses the display part 31 of the reflective display 30 in the upper and lower direction, when the planar light-emitting member 80 is seen from above. The OLED layer 83 includes OLED elements, and is arranged on the reflection electrodes 82. The reflection electrodes 82 are arranged to sandwich the OLED layer 83 with the reflection electrodes 82. A voltage is applied between the reflection electrodes 82 and the transparent electrode 84 via the light-transmittable substrate 81, so that light is emitted from the OLED layer 83. Light, which is to be directed toward the reflection electrodes 82, of the light to be emitted from the OLED layer 83 is blocked by the reflection electrodes 82 and is thus reflected toward the transparent electrode 84. In the meantime, the light directed toward the transparent electrode 84 passes through the transparent electrode 84.

In this way, the planar light-emitting member 80 is configured to emit the light L7 from the transparent electrode 84-side and not to emit the light from the light-transmittable substrate 81-side. Also, in the planar light-emitting member 80, a part of the light L8 to be incident from the transparent electrode 84-side passes through gaps between the reflection electrodes 82 and is emitted from the light-transmittable substrate 81-side, and a part of the light L9 to be incident from the light-transmittable substrate 81-side passes through the gaps between the reflection electrodes 82 and is emitted from the transparent electrodes 84-side. As described above, since the light-transmittable substrate 81 is located at the opposite side to the display part 31 of the reflective display 30, the planar light-emitting member 80 emits the light toward the display part 31 and does not emit the light the opposite side to the display part 31. Also, the planar light-emitting member 80 allows the light to be incident from the display part 31 side and the light to be incident from the opposite side to the display part 31 side to pass therethrough. Here, when the planar light-emitting member 80 is seen from above, portions of the planar light-emitting member 80 from which the light is to be emitted are portions in which the reflection electrodes 82 are formed. For this reason, it can be understood that the portions, in which the reflection electrodes 82 are formed, are light-emitting parts 85 from which the light is to be emitted toward the display part 31. Also, when the planar light-emitting member 80 is seen from above, portions through which the light to be incident from the display part 31 side and the light to be incident from the opposite side to the display part 31 are to pass are portions in which the reflection electrodes 82 are not formed, and are portions between the reflection electrodes 82. For this reason, it can be understood that the portion between the reflection electrodes 82 is a transmission part 86 through which the light to be incident from the display part 31 side and the light to be incident from the opposite side to the display part 31 are to pass. Therefore, the planar light-emitting member 80 has the plurality of light-emitting parts 85 configured to emit the light toward the display part 31 and the transmission parts 86 each of which is located between the light-emitting parts 85 and allows the light to be incident from the display part 31 side and the light to be incident from the opposite side to the display part 31 to pass therethrough. In other words, it can be understood that the planar light-emitting member 80 is configured to allow the light to be incident from the display part 31 side and the light to be incident from the opposite side to the display part 31 to pass therethrough, and to emit the light from the OLED layer 83, which is different from the light to be incident from the display part 31 side and the light to be incident from the opposite side to the display part 31, toward the display part 31. In the meantime, as described above, when the planar light-emitting member 80 is seen from above, the plurality of reflection electrodes 82 extends in linear shapes parallel with each other. Therefore, when the planar light-emitting member 80 is seen from above, the light-emitting parts 85 extend in linear shapes parallel with each other. Also, since the transmission part 86 is located between the light-emitting parts 85, it extends linearly, like the light-emitting part 85, when the planar light-emitting member 80 is seen from above. Also, in the fourth exemplary embodiment, a width W3 in the width direction of the reflection electrode 82 is set smaller than a width W4 between the reflection electrodes 82. In other words, a width in the width direction of the light-emitting part 85 is set smaller than a width between the light-emitting parts 85. In the meantime, the planar light-emitting member 80 is not particularly limited inasmuch as it allows the light to be incident from the display part 31 side and the light to be incident from the opposite side to the display part 31 to pass therethrough, and emits the light, which is different from the light to be incident from the display part 31 side and the light to be incident from the opposite side to the display part 31, toward the display part 31.

Figure 14:
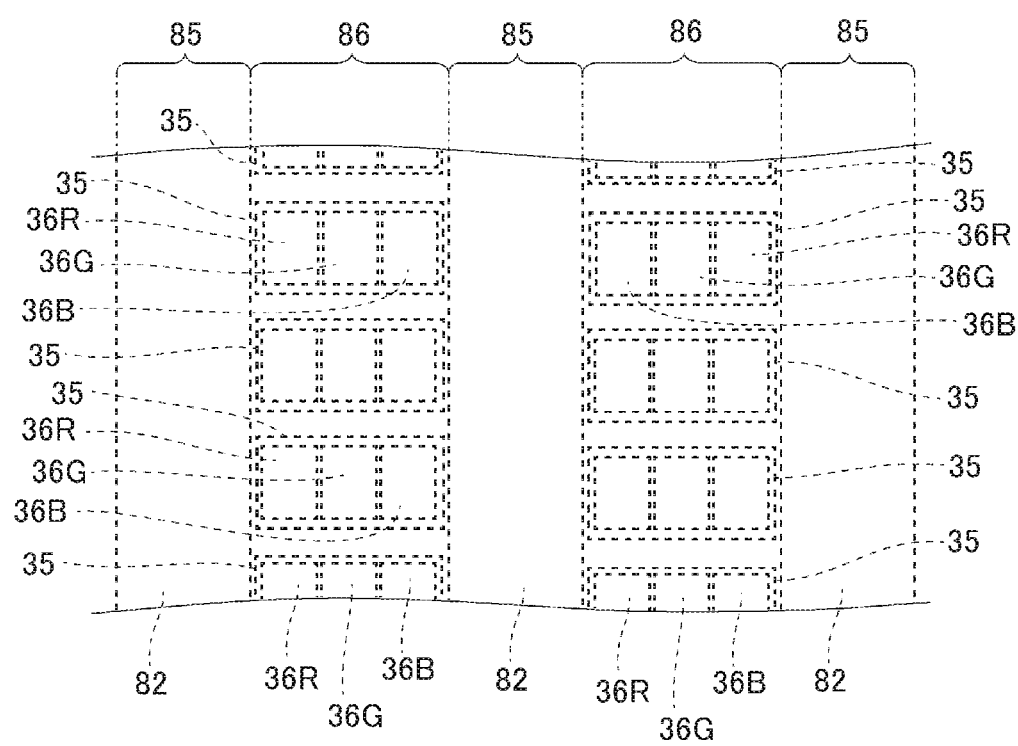
FIG. 14 is a partially enlarged view of FIG. 12, illustrating arrangement of reflection electrodes.

FIG. 14 is a partially enlarged view of FIG. 12, illustrating arrangement of the reflection electrodes. As shown in FIG. 14, when the planar light-emitting member 80 is seen from above, the reflection electrode 82 is located between the pixels 35 of the display part 31. For this reason, also in the planar light-emitting member 80, the light-emitting part 85 is located between the pixels 35 of the display part 31, and the light-emitting part 85 do not overlap the pixels 35. In the meantime, in the fourth exemplary embodiment, one reflection electrode 82 is located between the pixels 35 in the right and left direction. In other words, a pitch of the light-emitting parts 85 of the planar light-emitting member 80 is the same as the pitch of the pixels 35 in the right and left direction, and the pixels 35 are located in the transmission parts of the planar light-emitting member 80.

The planar light-emitting member 80 is bonded to the reflective display 30. Specifically, as shown in FIG. 13, one surface of the planar light-emitting member 80 is bonded to the display part 31 by a light-transmittable adhesive layer 90 arranged between the planar light-emitting member 80 and the display part 31. That is, the adhesive layer 90 is an adhesive layer for bonding the planar light-emitting member 80 and the display part 31 each other with being interposed between the planar light-emitting member 80 and the display part 31. In the fourth exemplary embodiment, the adhesive layer 90 is interposed between the planar light-emitting member 80 and the edge part cover 32, too, so that the planar light-emitting member 80 is bonded to the edge part cover 32, too. Also, the adhesive layer 90 is colorless and light-transmittable, and covers the display surface 31S of the display part 31 of the reflective display 30. For this reason, a part of the light to be emitted from a surface of the planar light-emitting member 80 facing toward the display part 31 is incident on the display part 31 through the adhesive layer 90. Also, a part of the light to be emitted from the display surface 31S of the display part 31 is incident on the planar light-emitting member 80 through the adhesive layer 90, and is emitted from a surface opposite to the display part 31 side through the transmission part 86 of the planar light-emitting member 80. In the meantime, a refractive index of the adhesive layer 90 of the fourth exemplary embodiment is set to a value between a refractive index of the transparent electrode 84 of the planar light-emitting member 80 and a refractive index of the member configuring the display surface 31S of the display part 31. The adhesive layer 90 is not particularly limited inasmuch as it is light-transmittable and can bond the planar light-emitting member 80 and the reflective display 30 each other. As a material of the adhesive layer 90, a thermoplastic resin, a thermosetting resin, a photo-curable resin and the like may be exemplified.

In the meantime, as described above, the reflective display 30 is arranged so that the display surface 31S of the display part 31 is to face the cover 13, the planar light-emitting member 80 covers the display surface 31S, and the adhesive layer 90 is interposed between the display surface 31S and the planar light-emitting member 80. Also, the cover 13 and the adhesive layer 90 are light-transmittable, and the planar light-emitting member 80 has the transmission parts 86. For this reason, the display surface 31S of the display part 31 of the reflective display 30 can be visually recognized from the outside of the vehicle VE through the cover 13, the opening of the frame body 11 facing toward the outside of the vehicle VE, the transmission parts 86 of the planar light-emitting member 80, and the adhesive layer 90. That is, the reflective display 30 can provide display toward the outside of the vehicle VE. Also, the reflective display 30 is arranged so that the outside light, which is the light from the light source such as the sun and a streetlamp located outside the vehicle VE, is to be incident on the display surface 31S of the display part 31.

As shown in FIG. 12, the control unit 70 is electrically connected to the scanning line drive circuit 34H and the data line drive circuit 34V of the display part 31 and the light-transmittable substrate 81 of the planar light-emitting member 80. The control unit 70 is configured to control light emission and non-emission states of each pixel 35 of the display part 31 and light emission and non-emission states of the light-emitting part 85 of the planar light-emitting member 80. The control unit 70 is configured to perform the control, based on a signal to be input from an outside to the control unit 70. In the fourth exemplary embodiment, the control unit 70 is electrically connected to the control device 75 of the vehicle VE, and the like.

Subsequently, operations of the display unit 20 are described.

In the below, a case where the stop lamp region 31A is turned on is exemplified, and descriptions of cases where the turn signal lamp region 31B is blinked and the rear lamp region 31C is turned on are omitted. In a case of an input state where a signal indicative of a brake operation from the control device 75 of the vehicle VE is detected and the signal indicative of the brake operation is input to the control unit, the control unit 70 controls the display part 31 and the planar light-emitting member 80 to turn on the stop lamp region 31A of the display part 31. Specifically, the control unit 70 controls the planar light-emitting member 80 to emit the light from the light-emitting parts 85 of the planar light-emitting member 80. The light emitted from the light-emitting parts 85 of the planar light-emitting member 80 is incident on the display surface 31S of the display part 31 through the adhesive layer 90. Also, the control unit 70 drives the scanning line drive circuit 34H and the data line drive circuit 34V. The scanning line drive circuit 34H and the data line drive circuit 34V adjust the dot for red display 36R of each pixel 35 of the stop lamp region 31A to a state where the incident light is to be reflected and the light is to be emitted. On the other hand, each dot for display of the other pixels 35 is adjusted to a state where the light is not to be emitted. For this reason, as described above, the light emitted from the planar light-emitting member 80 and incident on the display surface 31S of the display part 31 is emitted from the dot for red display 36R of each pixel 35 of the stop lamp region 31A adjusted to the state where the incident light is to be reflected and the light is to be emitted. Also, as described above, the outside light, which is the light from the light source such as the sun and a streetlamp located outside the vehicle VE, is also incident on the display surface 31S of the display part 31 of the reflective display 30. For this reason, the light incident on the display surface 31S is emitted from the dot for red display 36R of each pixel 35 of the stop lamp region 31A adjusted to the state where the incident light is to be reflected and the light is to be emitted, like the light that is to be emitted from the light-emitting part 85 of the planar light-emitting member 80 and to be incident on the display surface 31S. In this way, the light to be emitted from the light-emitting parts 85 of the planar light-emitting member 80 and the outside light are emitted from the dot for red display 36R of each pixel 35 of the stop lamp region 31A, so that the stop lamp region 31A is turned on and information, which indicates that a brake has been operated, is displayed by the marker lamp 1.

As described above, the marker lamp 1 that is the vehicular display device of the fourth exemplary embodiment includes the reflective display 30 configured to provide display toward the outside of the vehicle VE, and the planar light-emitting member 80 as the light emission member arranged to face the display part 31 of the reflective display 30. The planar light-emitting member 80 has the plurality of light-emitting parts 85 configured to emit the light toward the display part 31 and the transmission parts 86 each of which is located between the light-emitting parts 85 and allows the light to be incident from the display part 31 side and the light to be incident from the opposite side to the display part 31 to pass therethrough.

For this reason, the light to be incident on the transmission part 86 of the planar light-emitting member 80 can be incident on the display part 31 through the transmission part 86. Also, the light to be emitted from the display part 31 and to be incident on the transmission part 86 of the planar light-emitting member 80 can be emitted from the opposite side of the transmission part 86 to the display part 31 through the transmission part 86. For this reason, the reflective display 30 can display the information by using the outside light including the sunlight, and can suppress the visibility of the information from being lowered in the environment where the sunlight is irradiated, as compared to the self-luminous display. Also, since the light-emitting part 85 of the planar light-emitting member 80 is configured to emit the light toward the display part 31, the light to be emitted from the light-emitting part 85 can be incident on the display part 31. For this reason, the reflective display 30 can provide display by using the outside light and the light to be emitted from the light-emitting part 85. For this reason, even when an amount of the outside light to be incident on the display part 31 through the transmission part 86 is reduced, it is possible to suppress the luminance of the light to be emitted from the display part 31 of the reflective display 30 from being lowered. In this way, according to the marker lamp 1 of the fourth exemplary embodiment, it is possible to suppress the visibility of the information to be displayed from being lowered.

In the fourth exemplary embodiment, the light-emitting part 85 of the planar light-emitting member 80 is configured so that the light is not to be emitted toward the opposite side to the display part 31. For this reason, for example, even when the light is emitted from the light-emitting part 85, it is possible to suppress the visibility of the information to be displayed on the display part 31 from being lowered. In the meantime, the light-emitting part 85 may be configured to emit the light toward the opposite side to the display part 31. However, from the standpoint of suppressing the visibility of the information to be displayed on the display part 31 from being lowered, the light-emitting part 85 is preferably configured so that the light is not to be emitted toward the opposite side to the display part 31.

In the fourth exemplary embodiment, the marker lamp 1 has the light-transmittable adhesive layer 90 interposed between the planar light-emitting member 80 and the display part 31. For this reason, as compared to a configuration where an air layer is interposed between the planar light-emitting member 80 and the display part 31, it is possible to suppress the light, which is to be emitted from the light-emitting part 85 of the planar light-emitting member 80, from being Fresnel reflected on a surface of the planar light-emitting member 80 facing toward the display part 31. For this reason, since it is possible to cause more light to be incident on the display part 31, it is possible to further suppress the luminance of the light to be emitted from the display part 31 of the reflective display 30 from being lowered. Also, it is possible to suppress the light, which is to be emitted from the display part 31 of the reflective display 30, from being Fresnel reflected on the surface of the planar light-emitting member 80 facing toward the display part 31. For this reason, it is possible to suppress the luminance of the light to be emitted from the display part 31 and to pass through the transmission part 86 of the planar light-emitting member 80 from being lowered. Therefore, it is possible to suppress the visibility of the information to be displayed on the display part 31 from being lowered.

In the fourth exemplary embodiment, the plurality of light-emitting parts 85 of the planar light-emitting member 80 is respectively located between the pixels 35 of the display part 31, when the planar light-emitting member 80 is seen from above. For this reason, since the light-emitting parts 85 of the planar light-emitting member 80 and the pixels 35 of the display part 31 do not overlap, it is possible to suppress a situation as if the information to be displayed on the display part 31 is deficient. For this reason, it is possible to suppress the visibility of the information to be displayed on the display part 31 from being lowered due to the light-emitting parts 85 of the planar light-emitting member 80.

In the fourth exemplary embodiment, when the planar light-emitting member 80 is seen from above, the plurality of light-emitting parts 85 of the planar light-emitting member 80 extends in linear shapes parallel with each other, and a pitch of the light-emitting parts 85 is set to be the same as the pitch of the pixels 35 of the display part 31. For this reason, as compared to a configuration where the plurality of light-emitting parts 85 do not extend in linear shapes parallel with each other, the productivity of the planar light-emitting member 80 can be improved. Also, the moire, which is caused when the light-emitting parts 85 of the planar light-emitting member 80 and the information to be displayed on the display part 31 interfere with each other, can be suppressed from being generated. For this reason, it is possible to suppress the visibility of the information to be displayed on the display part 31 from being lowered due to the light-emitting parts 85.

In the meantime, from the standpoint of suppressing the visibility of the information to be displayed on the display part 31 from being lowered, when the planar light-emitting member 80 is seen from above, it is preferable that the plurality of light-emitting parts 85 extends in linear shapes parallel with each other and the width W3 in the width direction of the light-emitting part 85 is equal to or larger than 0.1 mm and equal to or smaller than 2.5 mm and is also smaller than the width W4 between the light-emitting parts 85. With the above configuration, it is difficult for a person to recognize the light-emitting parts 85, so that it is possible to suppress a situation as if the information to be displayed on the display part 31 superimposed on the light-emitting parts 85 is deficient. For this reason, it is possible to suppress the visibility of the information to be displayed on the display part 31 from being lowered due to the light-emitting parts 85.

In the fourth exemplary embodiment, the planar light-emitting member 80 configured to emit the light to be incident on the display part 31 of the reflective display 30 is provided. For this reason, since it is possible to display the information on the display part 31 at any time of night or day, the vehicular display device can function as the marker lamp 1.

Although the present invention has been described with reference to the exemplary embodiments, the present invention is not limited thereto.

In the present invention, the light emission member may be configured to allow the light to be incident from the display part 31 side and the light to be incident from the opposite side to the display part 31 side to pass therethrough, and to emit the light, which is different from the light to be incident from the display part 31 side and the light to be incident from the opposite side to the display part 31 side, toward the display part 31. Therefore, for example, in the exemplary embodiments, the plurality of step regions 43 of the light guide plate 40 as the light emission member may not be located between the pixels 35 of the display part 31, when the light guide plate 40 is seen from above. Also, in the exemplary embodiment, the plurality of light-emitting parts 85 of the planar light-emitting member 80 as the light emission member may not be located between the pixels 35 of the display part 31, when the planar light-emitting member 80 is seen from above. However, from the standpoint of suppressing the visibility of the information to be displayed on the display part 31 from being lowered, the step regions 43 of the light guide plate 40 as the light emission member and the light-emitting parts 85 of the planar light-emitting member 80 as the light emission member are preferably located between the pixels 35 of the display part 31.

Also, in the exemplary embodiments, the plurality of step regions 43 are formed as the regions extending in linear shapes parallel with each other, when the light guide plate 40 is seen from above. However, when the light guide plate 40 is seen from above, the plurality of step regions 43 may be regions extending intermittently in linear shapes, regions extending in curved shapes or lattice-shaped regions. Also, in the exemplary embodiment, the plurality of light-emitting parts 85 extends in linear shapes parallel with each other, when the light guide plate 40 is seen from above. However, the plurality of light-emitting parts 85 may extend intermittently in linear shapes or in curved shapes or may be formed in a lattice shape.

Also, in the exemplary embodiments, the pitch of the step regions 43 is the same as the pitch of the pixels 35 of the display part 31. However, from the standpoint of suppressing the moire, which is caused when the steps 44 and the information to be displayed on the display part 31 interfere with each other, from being generated, the pitch of the step regions 43 is preferably obtained by multiplying a natural number by the pitch of the pixels 35 of the display part 31. Also, in the exemplary embodiments, the pitch of the light-emitting parts 85 is the same as the pitch of the pixels 35 of the display part 31. However, from the standpoint of suppressing the moire, which is caused when the light-emitting parts 85 and the information to be displayed on the display part 31 interfere with each other, from being generated, the pitch of the light-emitting parts 85 is preferably obtained by multiplying a natural number by the pitch of the pixels 35 of the display part 31.

Also, in the exemplary embodiments, the reflection part 42 is configured to internally reflect the light to be incident from the incidence surface 41 toward the display part 31. However, from the standpoint of suppressing the luminance of the light, which is to be emitted from the display part 31 of the reflective display 30, from being lowered, it is preferable that the reflection part 42 is configured to internally reflect the light L1 to be incident from at least the incidence surface 41. With the above configuration, it is possible to internally reflect the light L1 to be incident from the incidence surface 41 on the reflection part 42 and to cause the same to be directed toward the steps 44. For this reason, as compared to a configuration where at least a part of a side surface of the light guide plate 40 is not formed as the reflection part 42 configured to internally reflect the light to be incident from the incidence surface 41, it is possible to cause more light to be incident on the display part 31, so that it is possible to further suppress the luminance of the light, which is to be emitted from the display part 31 of the reflective display 30, from being lowered. In this case, the step preferably has the inclined surface configured to reflect the light, which has been internally reflected on the reflection part 42, toward the display part 31.

Also, in the exemplary embodiments, the step 44 is configured as the depression in which the surface of the light guide plate 40 opposite to the display part 31 is concave toward the display part 31. However, the step 44 is not particularly limited inasmuch as it is configured to internally reflect the light, which is to be incident from the incidence surface 41, the incidence surface 41A for a light source or the incidence surface 41B for outside light and to be propagated in the light guide plate 40, toward the display part 31.

Also, in the exemplary embodiments, the light-transmittable adhesive layer 60 is interposed between the light guide plate 40 and the display part 31. However, the adhesive layer 60 may not be interposed between the light guide plate 40 and the display part 31, and the light guide plate 40 may be attached to the member different from the reflective display 30, for example, to the housing 10. However, as described above, from the standpoint of suppressing the visibility of the information to be displayed on the display part 31 from being lowered, the light-transmittable adhesive layer 60 is preferably interposed between the light guide plate 40 and the display part 31. Also, in the exemplary embodiment, the light-transmittable adhesive layer 90 is interposed between the planar light-emitting member 80 and the display part 31. However, the adhesive layer 90 may not be interposed between the planar light-emitting member 80 and the display part 31, and the planar light-emitting member 80 may be attached to the member different from the reflective display 30, for example, to the housing 10. However, as described above, from the standpoint of suppressing the visibility of the information to be displayed on the display part 31 from being lowered, the light-transmittable adhesive layer 90 is preferably interposed between the planar light-emitting member 80 and the display part 31.

Also, in the exemplary embodiments, the reflective display 30 is not provided with the light source. However, the reflective display may be a reflective display having a backlight or a front light, which is a light source.

Also, in the exemplary embodiments, one marker lamp 1 is respectively provided at both sides of the vehicle VE in the right and left direction. However, at least one marker lamp 1 may be respectively provided at both sides of the vehicle VE in the right and left direction, or a plurality of the marker lamps 1 may be provided at the left side, the right side or both right and left sides.

Also, in the exemplary embodiments, the marker lamp 1 has been exemplified as the vehicular display device. However, the vehicular display device is not limited to the marker lamp, and may be a display device configured to display an image and the like toward the outside of the vehicle. In the case of this display device, for example, the control unit 70 is electrically connected to an image display instruction unit and the like. The image display instruction unit is configured to output a signal for displaying an image on the display part 31. In the signal, information about contents of the image is included. The control unit 70 is configured to control the display part 31 to display an image on the display part 31, based on the signal from the image display instruction unit.

Also, in a case where the vehicular display device of the present invention is not the marker lamp or the like but a vehicular display device that is not required to be always displayed and has only to provide display during the daytime, the vehicular display device may not have the light source. For example, in the third exemplary embodiment, a configuration where the light source 50 is not provided may be exemplified.

Also, in the exemplary embodiments, the cover 13 is made of the colorless light-transmittable material. However, the cover 13 may be colored inasmuch as it is light-transmittable. However, the cover 13 is preferably colorless, from a standpoint of effectively using the light, which is to be incident on the display part 31 via the cover 13, for display of the display part 31.

Also, in the exemplary embodiments, the light guide plate 40 is made of the colorless light-transmittable material. However, the light guide plate 40 may be colored inasmuch as it is light-transmittable. However, since the light to be incident on the display part 31 via the light guide plate 40 is used for display of the display part 31, when the display part 31 is configured to provide display by a plurality of colors of lights, for example, the light guide plate 40 is preferably colorless.

According to the present invention, the vehicular display device capable of suppressing the visibility of the information to be displayed from being lowered is provided, and can be used in the field of the vehicle such as an automobile.

Fifth Exemplary Embodiment

Figure 15:
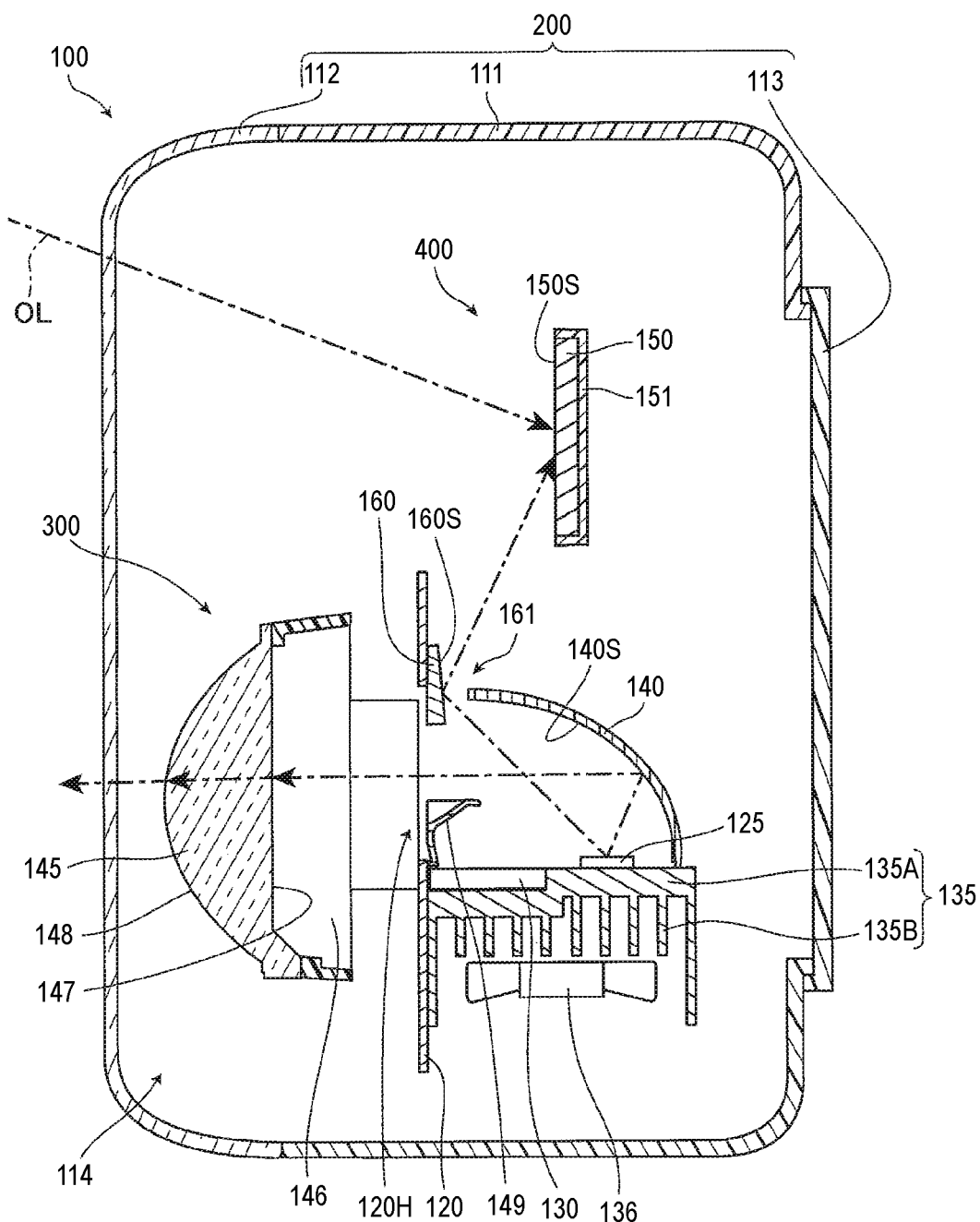
FIG. 15 is a sectional view schematically depicting a vehicular lamp according to a fifth exemplary embodiment of the present invention.

FIG. 15 is a sectional view schematically depicting a vehicular lamp according to a fifth exemplary embodiment, i.e., a vertical sectional view of the vehicular lamp. In the fifth exemplary embodiment, the vehicular lamp is configured as a headlight 100. The headlight is generally provided at each of right and left sides of the front of the vehicle, and the left and right headlights are substantially bilaterally symmetric. Therefore, in the fifth exemplary embodiment, one headlight is described.

As shown in FIG. 15, the headlight 100 of the fifth exemplary embodiment includes, as main configurations, a housing 200, a lamp unit 300, a reflective display 400, and a reflection member 160. For this reason, the headlight 100 can be understood as the vehicular display device.

The housing 200 includes, as main configurations, a lamp housing 111, a front cover 112, and a rear cover 113. A front side of the lamp housing 111 is opened, and the colorless light-transmittable front cover 112 is fixed to the lamp housing 111 so as to close the opening. A rear side of the lamp housing 111 is formed with an opening smaller than the front opening, and the rear cover 113 is fixed to the lamp housing 111 so as to close the opening. In the housing 200 configured as described above, an internal space 114 surrounded by the lamp housing 111, the front cover 112 and the rear cover 113 is formed. In the internal space 114, the lamp unit 300, the reflective display 400 and the reflection member 160 are accommodated.

The lamp unit 300 of the fifth exemplary embodiment includes, as main configurations, a base plate 120, a light source 125, a light emission control circuit 130, a heat sink 135, a cooling fan 136, a reflector 140, a projection lens 145, and a shade 149.

The base plate 120 is a metallic plate-shaped member extending in a substantially vertical direction, and is fixed to the housing 200 by a means (not shown). The base plate 120 is formed with an opening 120H penetrating the base plate 120. The opening 120H is located on a light path through which the light to be emitted from the light source 125 is to pass. In the fifth exemplary embodiment, the opening 120H is opened in the front and rear direction.

The light source 125 is a light-emitting element configured to emit light, for example, an LED configured to emit white light. The light emission of the light source 125 is controlled by the light emission control circuit 130. The heat sink 135 has a metallic base plate 135A extending in a substantially horizontal direction, and a lower surface of the base plate 135A is provided integrally with a plurality of heat radiation fins 35B. The cooling fan 136 is arranged with being spaced from the heat radiation fins 35B, and is fixed to the heat sink 135. The heat sink 135 is cooled by an air stream generated as a result of rotation of the cooling fan 136. On an upper surface of the base plate 135A of the heat sink 135, the light source 125 and the light emission control circuit 130 are placed.

The reflector 140 is fixed to the base plate 135A of the heat sink 135 with covering the light source 125 from above. A surface of the reflector 140 facing toward the light source 125 is formed as a reflection surface 140S configured to reflect the light without transmitting the same therethrough. The reflection surface 140S is a rotary elliptical curved surface, and the light source 125 is located at a first focus of the elliptical curved surface or in the vicinity of the first focus. At least a part of the light to be emitted from the light source 125 is reflected toward the projection lens 145 by the reflection surface 140S, and is emitted through the projection lens 145.

The projection lens 145 is an aspherical plano-convex lens, is arranged in front of the base plate 120, and is fixed to the base plate 120 via a lens holder 146. A surface of the projection lens 145 facing toward the base plate 120 is configured as a planar incidence surface 147, and an opposite surface to the base plate 120 is configured as a convex emission surface 148 that is convex toward an opposite side to the base plate 120. In the fifth exemplary embodiment, the projection lens 145 is arranged so that a rear focus of the projection lens 145 is located at a second focus of the reflection surface 140S of the reflector 140 or in the vicinity of the second focus. That is, in the lamp unit 300 of the fifth exemplary embodiment, a PES (Projector Ellipsoid System) optical system is adopted.

The shade 149 is a member arranged between the light source 125 and the projection lens 145 and configured to shield a part of the light to be emitted from the light source 125. The light to be emitted from the light source 125 is incident on the incidence surface 147 of the projection lens 145 with being controlled by the shade 149, so that the light of a light distribution pattern corresponding to a shape of the shade 149 is emitted from the emission surface 148 of the projection lens 145. The light emitted from the emission surface 148 of the projection lens 145 passes through the front cover 112 and is emitted toward the front of the vehicle, which is the outside of the vehicle. In the fifth exemplary embodiment, an upper end portion of the shade 149 is located at the second focus of the reflection surface 140S of the reflector 140 or in the vicinity of the second focus, and the shade 149 is configured to shield a part of the light to be emitted from the light source 125 so that a light distribution pattern of the light to be emitted from the emission surface 148 of the projection lens 145 is to be a light distribution pattern for a low beam.

The reflective display 400 includes, as main configurations, a display part 150 and an edge part cover 151, and is fixed to the housing 200 by a means (not shown). In the meantime, in FIG. 15, an interior of the display part 150 is not shown. The edge part cover 151 is configured to cover an entire circumference of side surfaces and a rear surface of the display part 150. The edge part cover 151 is not particularly limited, and for example, may be configured not to cover the rear surface of the display part 150, and the reflective display 400 may not include the edge part cover 151.

The reflective display 400 of the fifth exemplary embodiment is a display configured to reflect the light, which is to be incident from the display surface 150S of the display part 150, in the display part 150 and to emit the same from the display surface 150S, thereby providing display. For example, the reflective display 400 is configured by a reflective liquid crystal display. The reflective display 400 is arranged above the reflector 140 of the lamp unit 300 so that the display surface 150S of the display part 150 is to face forward the front cover 112. When the display part 150 is see from the front, the display part 150 is arranged so that it does not overlap the lamp unit 300 at a position closer to the front cover 112 than the display part 150. For this reason, the display surface 150S can be visually recognized through the front cover 112 and the front opening of the lamp housing 111 from the front of the vehicle, and the reflective display 400 can provide display toward the outside of the vehicle. Also, the reflective display 400 is arranged so that the outside light OL, which is the light from the light source such as the sun and a streetlamp located outside the vehicle, is to be incident on the display surface 150S of the display part 150 via the front cover 112.

Figure 16:
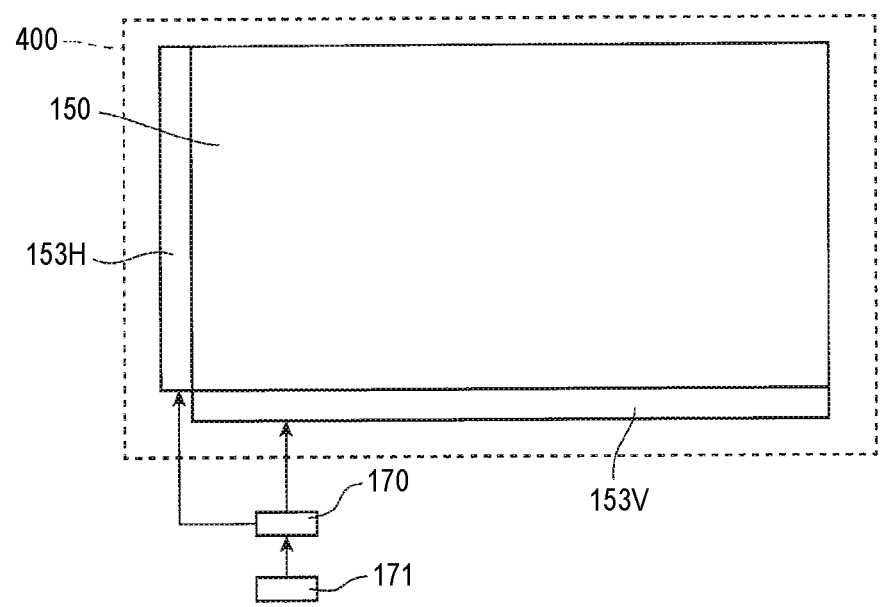
FIG. 16 is a front view of the reflective display shown in FIG. 15.

FIG. 16 is a front view of the reflective display shown in FIG. 15. In the meantime, in FIG. 16, the edge part cover 151 is not shown. The display part 150 has a rectangular outer shape, and a plurality of pixels arranged in a matrix shape is provided in the rectangular outer shape. Each pixel includes a dot for red display configured to reflect incident light and to emit red light, a dot for green display configured to reflect incident light and to emit green light, and a dot for blue display configured to reflect incident light and to emit blue light. Therefore, in the fifth exemplary embodiment, the reflective display 400 can provide RGB color display. Also, as shown in FIG. 16, a scanning line drive circuit 153H is disposed at a lateral side of the display part 150, and a data line drive circuit 153V is disposed at one side of the display part 150 in the upper and lower direction. The scanning line drive circuit 153H and the data line drive circuit 153V are electrically connected to each dot for display of each pixel. A voltage is applied from the scanning line drive circuit 153H and the data line drive circuit 153V to each dot for display, so that reflection and non-reflection states of light to be incident on each dot for display of RGB and an amount of light to be reflected are controlled. That is, emission and non-emission states of the light from each dot for display of RGB and an amount of light to be emitted are controlled. A control unit 170 is electrically connected to the scanning line drive circuit 153H and the data line drive circuit 153V. The control unit 170 is configured to control light emission and non-emission states of each pixel of the display part 150. The control unit 170 is configured to perform the control, based on a signal to be input from an outside to the control unit 170. In the fifth exemplary embodiment, the control unit 170 is electrically connected to a control device 171 of the vehicle, and the like.

As shown in FIG. 15, the reflection member 160 of the fifth exemplary embodiment is a plate-shaped member extending in the upper and lower direction. The reflection member 160 is inserted into an opening 161 formed between the base plate 120 and a front end portion of the reflector 140 and is fixed to the base plate 120. The reflection member 160 has a reflection surface 160S at an opposite side to the base plate 120, and the reflection surface 160S is configured to reflect a part of the light to be emitted from the light source 125 and to cause the same to be incident on the display surface 150S of the display part 150. That is, a part of the light emitted from the light source 125 is incident on the display surface 150S of the display part 150 through the opening 161 formed between the base plate 120 and the front end portion of the reflector 140 by the reflection member 160. In the meantime, the reflection member 160 is not particularly limited inasmuch as it can cause a part of the light to be emitted from the light source 125 to be incident on the display surface 150S of the display part 150. For example, the reflection surface 160S of the reflection member 160 may be a flat surface or a curved surface. Also, the reflection member 160 may be fixed to the member different from the base plate 120, for example, to the reflector 140 or the lamp housing 111. Also, the reflection member 160 may be arranged between the projection lens 145 and the base plate 120 so that the light is to be incident on the display surface 150S of the display part 150 through an opening different from the opening 161, for example, an opening formed between the projection lens 145 and the base plate 120.

Here, as described above, the reflective display 400 is arranged above the reflector 140, and the reflector 140 is fixed to the base plate 135A of the heat sink 135 with covering the light source 125 from above. For this reason, the reflector 140 is arranged between the light source 125 and the reflective display 400. Also, as described above, the surface of the reflector 140 facing toward the light source 125 is formed as the reflection surface 140S configured to reflect the light without transmitting the same therethrough. Also, the light, which is to be incident on the display part 150, of the light to be emitted from the light source 125 is light to be reflected on the reflection surface 160S of the reflection member 160 and is different from light to be reflected on the reflection surface 140S of the reflector 140 and to be incident on the projection lens 145. Therefore, the reflector 140 is arranged at least between the light source 125 and the reflective display 400, and is configured to reflect at least a part of the light, which is different from the light to be incident on the display part 150, of the light to be emitted from the light source 125.

Subsequently, operations of the headlight 100 of the fifth exemplary embodiment are described.

As shown in FIG. 15, the white light emitted from the light source 125 is mainly reflected on the reflection surface 140S of the reflector 140 but a part of the white light is reflected on the reflection surface 160S of the reflection member 160. A part of the light reflected on the reflection surface 140S of the reflector 140 is shielded by the shade 149, and the other part is incident on the incidence surface 147 of the projection lens 145 and is emitted from the emission surface 148. The light emitted from the emission surface 148 passes through the front cover 112 and is emitted toward the front of the vehicle. As described above, since the shade 149 shields a part of the light from the light source 125 so that a light distribution pattern of the light to be emitted from the emission surface 148 of the projection lens 145 is to be a light distribution pattern for a low beam, a low beam is emitted from the headlight 100.

As described above, since the reflective display 400 is arranged so that the outside light OL is to be incident on the display surface 150S of the display part 150, it is arranged to provide display toward the outside of the vehicle. For this reason, during the daytime, the reflective display 400 reflects the outside light OL including at least the sunlight in the display part 150 and emits the same from the display surface 150S, thereby displaying the information on the display part 150. In the meantime, in a dark environment such as night-time, since the headlight 100 is turned on so as to emit the low beam, the light is emitted from the light source 125 of the lamp unit 300, and a part of the light is reflected on the reflection surface 160S of the reflection member 160 and is incident on the display surface 150S of the display part 150 of the reflective display 400. For this reason, the reflective display 400 reflects the light emitted from at least the light source 125 in the display part 150 and emits the same from the display surface 150S, thereby displaying the information on the display part 150. When the headlight 100 is turned on during the daytime, the reflective display 400 displays the information on the display part 150 by using the outside light OL and a part of the light to be emitted from the light source 125. In the meantime, the information that is to be displayed on the display part 150 is not particularly limited. For example, a character or an image may be displayed on the display part 150, or the display part 150 may emit the light in a predetermined color, so that the reflective display 400 may function as a lamp.

As described above, the headlight 100 that is the vehicular display device of the fifth exemplary embodiment includes the reflective display 400 configured to provide display toward the outside of the vehicle. On the display part 150 of the reflective display 400, a part of the light to be emitted from the light source 125 of the lamp unit 300 configured to emit the light toward the outside of the vehicle is incident.

In the headlight 100 of the fifth exemplary embodiment, since the reflective display 400 provides display toward the outside of the vehicle, the outside light OL that is the light from the light source such as the sun and a streetlamp located outside the vehicle can be incident on the display part 150 of the reflective display 400. For this reason, the reflective display 400 can display the information by using the outside light OL including the sunlight, and can suppress the visibility of the information from being lowered in the environment where the sunlight is irradiated, as compared to the self-luminous display. Meanwhile, in the dark environment such as night-time, an amount of the light OL to be incident on the display part 150 is reduced, as compared to the environment where the sunlight is irradiated. In such environment, the lamp is generally turned on, so that the light is emitted from the light source of the lamp unit of the lamp. In this case, in the headlight 100 of the fifth exemplary embodiment, since a part of the light to be emitted from the light source 125 of the lamp unit 300 is incident on the display part 150, the reflective display 400 can provide display by using the part of the light to be emitted from the light source 125 of the lamp unit 300. For this reason, even when an amount of the light OL to be incident on the display part 150 is reduced, the headlight 100 is turned on, so that it is possible to suppress the luminance of the light, which is to be emitted from the display part 150 of the reflective display 400, from being lowered. In this way, the headlight 100 of the fifth exemplary embodiment can suppress the visibility of the information to be displayed from being lowered.

The headlight 100 of the fifth exemplary embodiment includes the reflection member 160 configured to reflect a part of the light to be emitted from the light source 125 and to cause the same to be incident on the display part 150. For this reason, since it is possible to guide a part of the light to be emitted from the light source 125 of the lamp unit 300 to a desired position, it is possible to improve the degree of design freedom of arrangement and direction of the reflective display 400 with respect to the light source 125 of the lamp unit 300, as compared to a configuration where the reflection member 160 is not provided.

In the fifth exemplary embodiment, the headlight 100 includes the lamp unit 300. Also, the lamp unit 300 includes the reflector 140 arranged at least between the light source 125 and the reflective display 400 and configured to reflect at least a part of the light, which is different from the light to be incident on the display part 150, of the light to be emitted from the light source 125. The light, which is different from the light to be incident on the display part 150, of the light to be emitted from the light source 125 of the lamp unit 300 toward the reflective display 400 is reflected and blocked by the reflector 140, so that it is possible to suppress the corresponding light from being incident on the display part 150. In the meantime, if the reflector 140 is not arranged between the light source 125 and the reflective display 400, the light, which is different from the light to be incident on the display part 150, of the light to be emitted from the light source 125 of the lamp unit 300 toward the reflective display 400 may be incident on the display part 150. In this case, the light that is different from the light to be incident on the display part 150 is reflected on the display surface 150S of the display part 150, so that a person outside the vehicle may be dazzled. However, according to the headlight 100 of the fifth exemplary embodiment, it is possible to suppress the light from being incident on the display part by the reflector 140, so that it is possible to suppress the person outside the vehicle from being dazzled. Therefore, it is possible to suppress the visibility of the information to be displayed on the display part 150 from being lowered.

In the fifth exemplary embodiment, the light source 125 is configured to emit the white light. For this reason, the reflective display 400 can provide RGB color display.

Sixth Exemplary Embodiment

Figure 17:
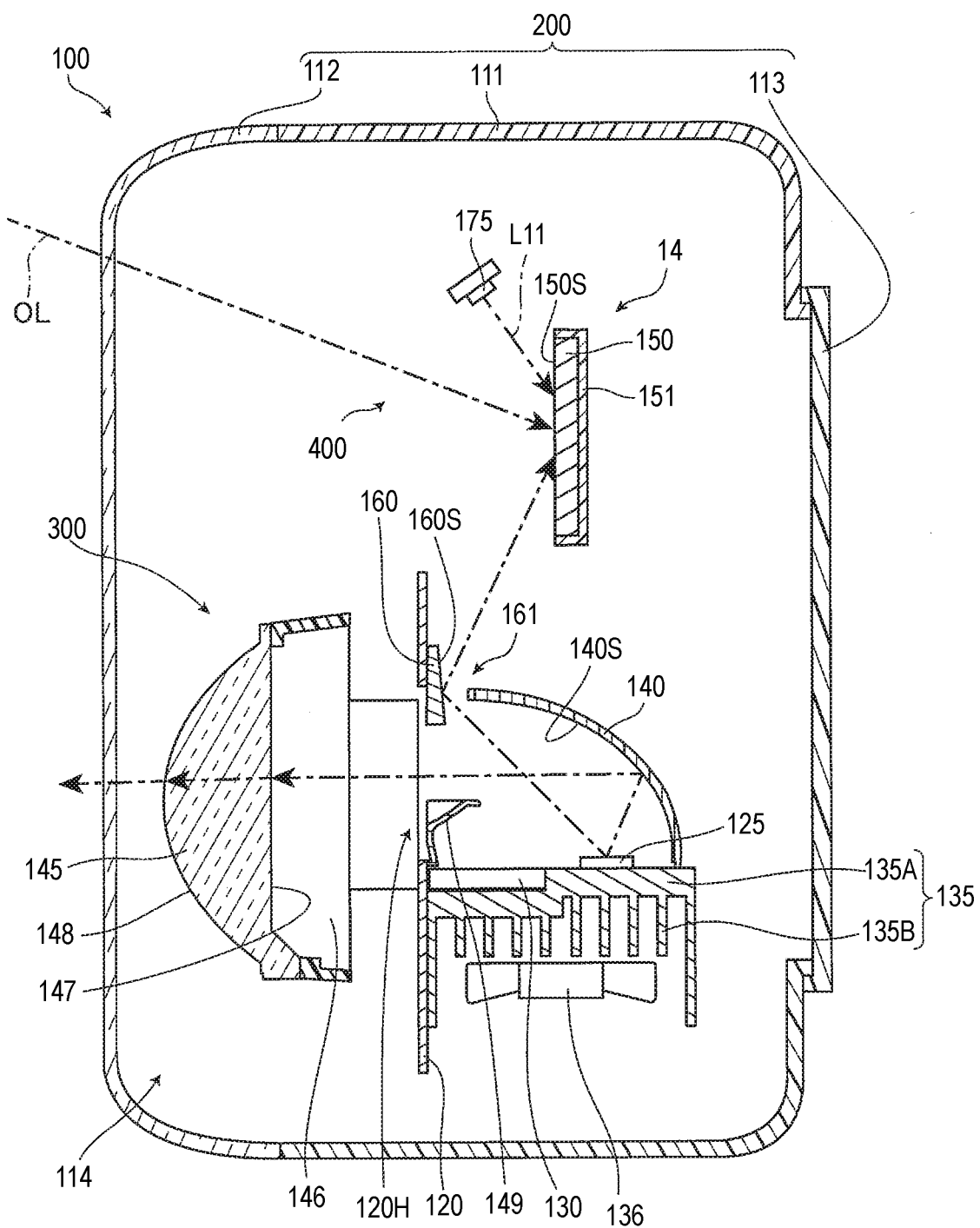
FIG. 17 depicts a vehicular lamp according to a sixth exemplary embodiment of the present invention, in the same manner as FIG. 15.

Subsequently, a sixth exemplary embodiment of the present invention is described in detail with reference to FIG. 17. FIG. 17 depicts a vehicular lamp according to the sixth exemplary embodiment of the present invention, in the same manner as FIG. 15. In the meantime, the constitutional elements, which are the same as or equivalent to the fifth exemplary embodiment, are denoted with the same reference numerals and the overlapping descriptions thereof are omitted, unless particularly described.

As shown in FIG. 17, a headlight 100 that is the vehicular display device of the sixth exemplary embodiment is different from the headlight 100 of the fifth exemplary embodiment, in that an auxiliary light source 175 is provided.

The auxiliary light source 175 of the sixth exemplary embodiment is arranged at a position closer to the front cover 112 than the display part 150, and is configured to emit the light L11 to be incident on the display part 150. The auxiliary light source 175 does not overlap the display part 150, when the reflective display 400 is seen through the front cover 112. For this reason, the visibility of the information to be displayed on the display part 150 and an amount of the light OL to be incident on the display part 150 are suppressed from being lowered due to the auxiliary light source 175. The auxiliary light source 175 is an LED configured to emit the white light, for example, and is electrically connected to the control unit 170. In the sixth exemplary embodiment, the control unit 170 is configured to control light emission and non-emission states of the auxiliary light source 175. Specifically, the control unit 170 controls the auxiliary light source 175 so that the light is to be emitted when the reflective display 400 displays the information and the light is not to be emitted when the reflective display 400 does not display the information. For this reason, even when the light is not emitted from the light source 125 of the lamp unit 300 in the dark environment such as night-time, the light to be emitted from the auxiliary light source 175 is incident on the display part 150, so that the reflective display 400 can display the information. For this reason, the reflective display 400 can be used as a marker lamp such as a vehicle width lamp, a turn signal lamp and the like provided to the vehicle, for example.

Seventh Exemplary Embodiment

Figure 18:
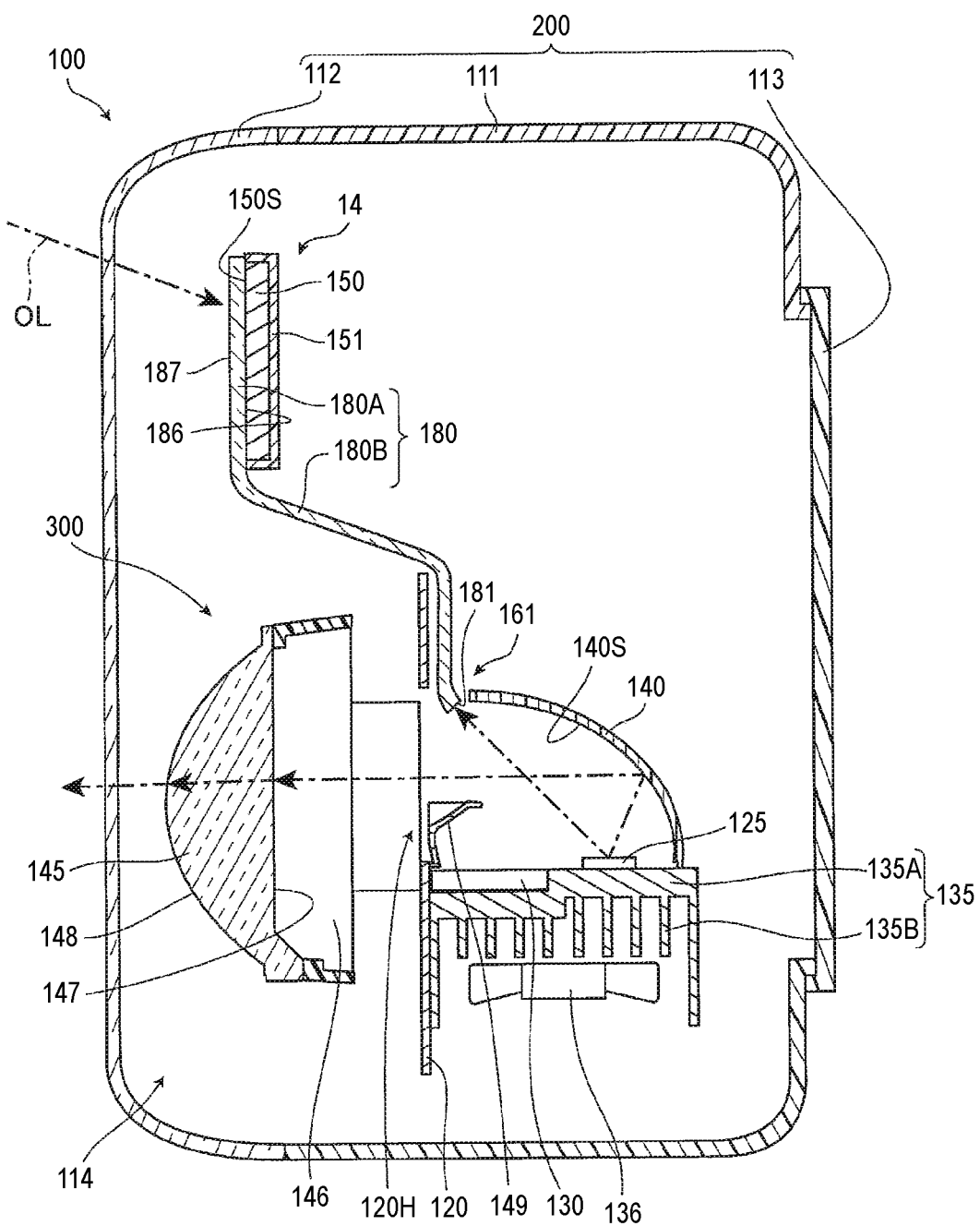
FIG. 18 depicts a vehicular lamp according to a seventh exemplary embodiment of the present invention, in the same manner as FIG. 15.

Subsequently, a seventh exemplary embodiment of the present invention is described in detail with reference to FIGS. 18 to 21. FIG. 18 depicts a vehicular lamp according to the seventh exemplary embodiment of the present invention, in the same manner as FIG. 15. In the meantime, the constitutional elements, which are the same as or equivalent to the fifth exemplary embodiment, are denoted with the same reference numerals and the overlapping descriptions thereof are omitted, unless particularly described.

As shown in FIG. 18, a headlight 100 that is a vehicular display device of the seventh exemplary embodiment is different from the headlight 100 of the fifth exemplary embodiment, in that the reflective display 400 is arranged above the projection lens 145 of the lamp unit 300 and a light guide member 180 is provided instead of the reflection member 160.

In the seventh exemplary embodiment, the reflective display 400 is arranged above the projection lens 145 so that the display surface 150S of the display part 150 is to face forward the front cover 112. That is, the reflective display 400 of the seventh exemplary embodiment is arranged closer to the front cover 112 and more spaced from the light source 125 of the lamp unit 300, as compared to the reflective display 400 of the fifth exemplary embodiment. The reflective display 400 can be visually recognized from the outside of the vehicle through the front cover 112, and the reflective display 400 can provide display toward the outside of the vehicle. Also, the reflective display 400 is arranged so that the outside light OL is to be incident on the display surface 150S of the display part 150 through the front cover 112.

The light guide member 180 of the seventh exemplary embodiment is made of a clear light-transmittable resin, for example, and has an emission part 180A and a light guide part 180B. The emission part 180A has a flat plate shape having a rectangular outer shape, and one surface 186 is arranged to face the display surface 150S of the display part 150 of the reflective display 400. When the emission part 180A is seen from above, the emission part 180A covers the entire display surface 150S of the display part 150. The light guide part 180B has a plate shape extending in the upper and lower direction. A lower portion of the light guide part 180B is inserted in the opening 161, and a lower side surface, which is a lower end portion of the light guide part 180B, is formed as an incidence surface 181 on which a part of the light to be emitted from the light source 125 is to be incident. For this reason, the light emitted from the light source 125 and incident on the incidence surface 181 is propagated in the light guide part 180B from the incidence surface 181 toward an upper side surface, which is a side surface opposite to the incidence surface 181. An upper side surface, which is an upper end portion of the light guide part 180B, is connected to the lower side surface of the emission part 180A. For this reason, the light emitted from the light source 125 and incident on the incidence surface 181 of the light guide part 180B is incident on the emission part 180A from the lower side surface of the emission part 180A, and is propagated in the emission part 180A from the lower side surface toward the upper side surface. In the meantime, the light guide part 180B is not particularly limited inasmuch as it guides the light incident on the incidence surface 181 toward the emission part 180A. For example, the light guide part 180B may be configured by a plurality of pillar-shaped members.

Figure 19:
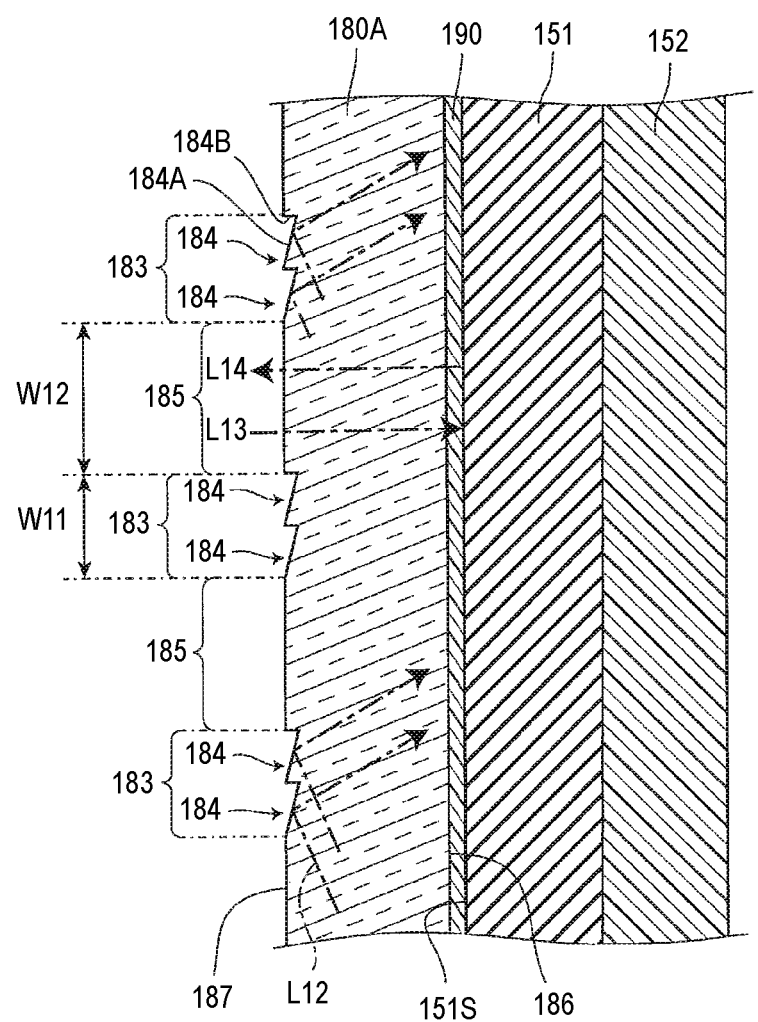
FIG. 19 is a partially enlarged view of FIG. 18.

FIG. 19 is a partially enlarged view of FIG. 18, depicting a vicinity of the emission part 180A. As shown in FIG. 19, a surface 187 of the emission part 180A opposite to the display part 150 is provided with a plurality of step regions 183, in each of which steps 184 are formed, and a planar region 185 located between the step regions 183.

The step 184 is a depression in which the surface 187 of the emission part 180A opposite to the display part 150 is concave toward the display part 150. The step 184 of the seventh exemplary embodiment has an inclined surface 184A and a connection surface 184B.

The inclined surface 184A is a surface inclined toward the display part 150 from the lower side toward the upper side. That is, the inclined surface 184A is a surface inclined toward the display part 150 in a propagation direction of light to be propagated from the lower side surface toward the upper side surface in the emission part 180A. The connection surface 184B is a surface that connects to an upper end of the inclined surface 184A and is substantially parallel with a thickness direction of the emission part 180A. Also, when the emission part 180A is seen from above, the step 184 extends linearly from one edge to the other edge in the right and left direction, and two steps 184 are formed in parallel without a gap in one step region 183. For this reason, the plurality of step regions 183 is regions extending in linear shapes parallel with each other and is substantially parallel with the lower side surface of the emission part 180A, when the emission part 180A is seen from above. For this reason, a part of light L12 incident on the incidence surface 181 and propagated in the emission part 180A is internally reflect on the inclined surface 184A of the step 184 toward the display part 150 and is emitted from a surface 186 facing toward the display part 150. That is, the surface 186 facing toward the display part 150 can be understood as an emission surface from which a part of the light L12 incident on the incidence surface 181 of the light guide part 180B and propagated in the emission part 180A is to be emitted. In the meantime, the number of steps 184 to be formed in one step region 183 is not particularly limited.

In the meantime, as described above, since the planar region 185 is planar, a part of light L13 to be incident on the planar region 185 is emitted from the surface 186 facing toward the display part 150 through the emission part 180A. Also, a part of light L14 to be incident on the surface 186 facing toward the display part 150 is emitted from the planar region 185 through the emission part 180A. For this reason, the emission part 180A allows the light L14 to be incident from the display part 150-side and the light L13 to be incident from the opposite side to the display part 150-side to pass therethrough. Also, the emission part 180A emits the light L12 to be incident from the incidence surface 181 of the light guide part 180B, which is different from the light L14 to be incident from the display part 150-side and the light L13 to be incident from the opposite side to the display part 150, toward the display part 150.

In the meantime, as described above, when the emission part 180A is seen from above, the plurality of step regions 183 is regions extending in linear shapes parallel with each other, and the planar region 185 is located between the step regions 183. For this reason, when the emission part 180A is seen from above, the planar region 185 is a region extending in a linear shape, like the step region 183.

Also, in the seventh exemplary embodiment, a width W11 in a width direction of the step region 183 is smaller than a width W12 between the step regions 183. The width W12 between the step regions 183 is a width of the planar region 185 in the width direction of the step region 183. In the meantime, the width W11 in the width direction of the step region 183 may be the same as the width W12 between the step regions 183 or may be larger than width W12 between the step regions 183.

Figure 20:
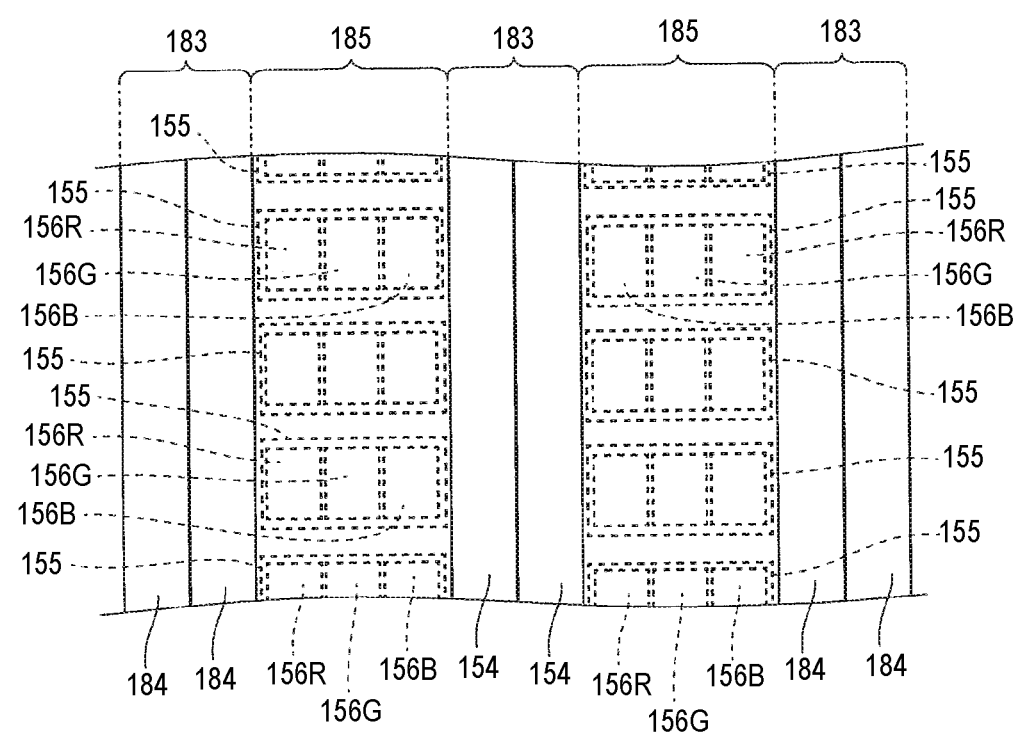
FIG. 20 illustrates arrangement of the step regions.

FIG. 20 illustrates arrangement of the step regions, i.e., an enlarged plan view of the emission part 180A rotated by 90°, in which the display part 150 is also shown. As shown in FIG. 20, when the emission part 180A is seen from above, the step region 183 is located between the pixels 155 of the display part 150 including a dot for red display 156R, a dot for green display 156G and a dot for blue display 156B. For this reason, when the emission part 180A is seen from above, the step region 183 does not overlap the pixels 155 of the display part 150. In the meantime, in the seventh exemplary embodiment, one step region 183 is located between the pixels 155 in the upper and lower direction. In other words, a pitch of the step regions 183 is the same as a pitch of the pixels 155 in the right and left direction, and the pixels 155 are located in the planar region 185.

Figure 21:
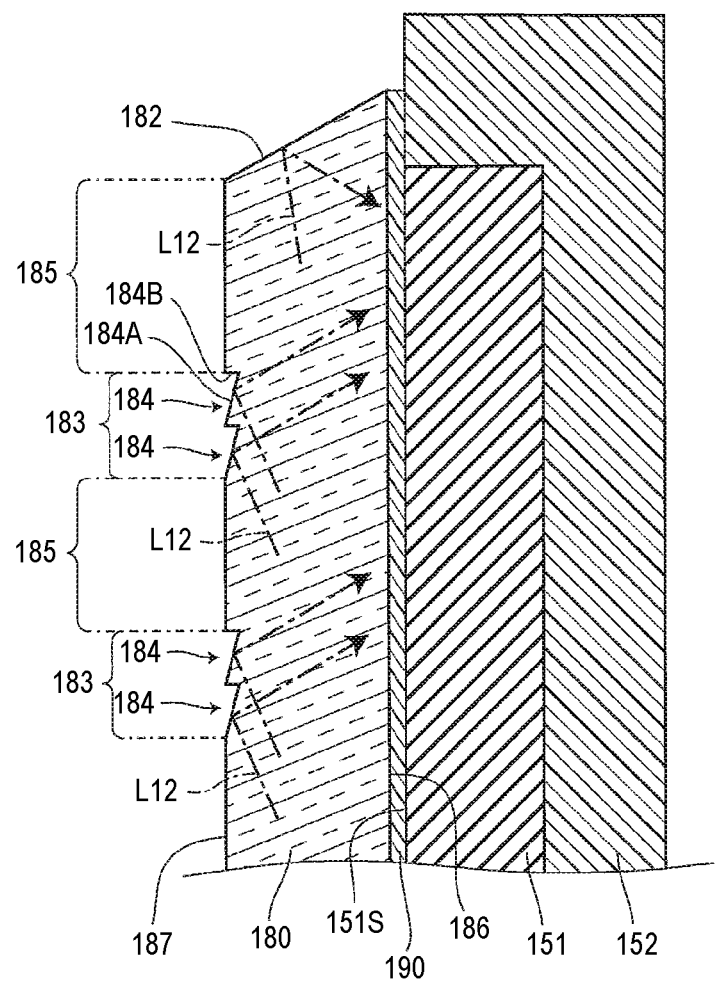
FIG. 21 is another partially enlarged view of FIG. 18.

FIG. 21 is an enlarged view of another part of FIG. 18, i.e., an enlarged view in the vicinity of an upper side surface of the emission part 180A. As shown in FIG. 21, the upper side surface that is an opposite side to the light guide part 180B-side is formed as a reflection part 182 inclined toward the display part 150 in a propagation direction of the light L12 to be incident on the incidence surface 181 of the light guide part 180B and to be propagated in the emission part 180A. For this reason, a part of the light L12 to be incident on the incidence surface 181 and to be propagated in the emission part 180A is internally reflected on the reflection part 182 toward the display part 150. That is, the reflection part 182 is configured to internally reflect a part of the light L12 toward the display part 150.

The emission part 180A is bonded to the reflective display 400. Specifically, as shown in FIGS. 19 and 21, one surface 186 of the emission part 180A is bonded to the display part 150 by a light-transmittable adhesive layer 190 arranged between the emission part 180A and the display part 150. That is, the adhesive layer 190 is an adhesive layer for bonding the emission part 180A and the display part 150 each other with being interposed between the emission part 180A and the display part 150. In the seventh exemplary embodiment, the adhesive layer 190 is interposed between the emission part 180A and the edge part cover 151, too, so that the emission part 180A is bonded to the edge part cover 151, too. Also, the adhesive layer 190 is colorless and light-transmittable, and covers the display surface 150S of the display part 150 of the reflective display 400. For this reason, a part of the light to be emitted from a surface of the emission part 180A facing toward the display part 150 is incident on the display part 150 through the adhesive layer 190. Also, a part of the light to be emitted from the display surface 150S of the display part 150 is incident on the emission part 180A through the adhesive layer 190, and is emitted from the planar region 185 through the emission part 180A. In the meantime, a refractive index of the adhesive layer 190 of the seventh exemplary embodiment is set to a value between a refractive index of the emission part 180A and a refractive index of the member configuring the display surface 150S of the display part 150. The adhesive layer 190 is not particularly limited inasmuch as it is light-transmittable and can bond the emission part 180A and the reflective display 400 each other. As a material of the adhesive layer 190, a thermoplastic resin, a thermosetting resin, a photo-curable resin and the like may be exemplified.

In the headlight 100 that is the vehicular display device of the seventh exemplary embodiment, as described above, the reflective display 400 is arranged so that the outside light OL is to be incident on the display surface 150S of the display part 150 through the front cover 112. Also, the emission part 180A of the light-transmittable light guide member 180 covers the display surface 150S of the reflective display 400. For this reason, the outside light OL is incident on the opposite surface 187 of the emission part 180A to the display surface 150S through the front cover 112 and the emission part 180A. As described above, the emission part 180A allows the light L14, which is to be incident from the display part 150, and the light L13, which is to be incident from the opposite side to the display part 150, to pass therethrough. Therefore, the reflective display 400 can display the information by using the outside light OL including the sunlight, and can suppress the visibility of the information from being lowered in the environment where the sunlight is irradiated, as compared to the self-luminous display. Also, the light guide member 180 has the incidence surface 181, on which a part of the light to be emitted from the light source 125 of the lamp unit 300 is to be incident, and one surface 186 of the emission part 180A, which is the emission surface from which the light to be incident from the incidence surface 181 is to be emitted toward the display part 150. For this reason, a part of the light to be emitted from the light source 125 of the lamp unit 300 is incident on the display part 150 of the reflective display 400, so that the reflective display 400 can provide display by using a part of the light to be emitted from the light source 125 of the lamp unit 300. For this reason, even when an amount of the light OL to be incident on the display part 150 is reduced, the headlight 100 is turned on, so that it is possible to suppress the luminance of the light to be emitted from the display part 150 of the reflective display 400 from being lowered. Also, it is possible to guide a part of the light, which is to be emitted from the light source 125 of the lamp unit 300, to a desired position by the light guide member 180. For this reason, as compared to a configuration where the light guide member 180 is not provided, it is possible to improve the degree of design freedom of arrangement and direction of the reflective display 400 with respect to the light source 125 of the lamp unit 300. Also, as compared to a configuration where the light guide member 180 is not provided, the reflective display 400 can be arranged with being spaced from the light source 125 of the lamp unit 300.

In the seventh exemplary embodiment, the upper side surface of the emission part 180A, which is opposite to the light guide part 180B, is formed as the reflection part 182 configured to internally reflect the light L12 that is to be incident on the incidence surface 181 of the light guide part 180B and to be propagated in the emission part 180A. That is, the reflection part 182 is configured to internally reflect a part of the light L12 toward the display part 150. For this reason, it is possible to internally reflect the light, which is to be incident from the incidence surface 181 of the light guide part 180B, on the reflection part 182 and to cause the same to be incident on the display part 150. For this reason, as compared to a configuration where at least a part of the side surface of the emission part 180A is not formed as the reflection part 182 configured to internally reflect the light, which is to be incident from the incidence surface 181, toward the display part 150, it is possible to cause more light to be incident on the display part 150. Therefore, it is possible to further suppress the luminance of the light to be emitted from the display part 150 of the reflective display 400 from being lowered.

In the meantime, from the standpoint of further suppressing the luminance of the light to be emitted from the display part 150 of the reflective display 400 from being lowered, a reflection member may be provided on the inclined surface 184A of the step 184 of the emission part 180A, and a reflection member may be provided on the reflection part 182 that is the upper side surface of the emission part 180A. As the reflection member, for example, a reflection film formed by metal vapor deposition or the like, a metal plate and the like may be exemplified. The step 184 can cause the light L12, which is to be incident from the incidence surface 181 and to be propagated in the emission part 180A, to be more internally reflected toward the display part 150, as compared to a configuration where the reflection member is not provided. For this reason, it is possible to further suppress the luminance of the light to be emitted from the display part 150 of the reflective display 400 from being lowered. Also, as compared to a configuration where the reflection member is not provided, the reflection part 182 can more internally reflect the light L12, which is to be incident from the incidence surface 181 and to be propagated in the emission part 180A, toward the display part 150. For this reason, it is possible to further suppress the luminance of the light to be emitted from the display part 150 of the reflective display 400 from being lowered.

In the seventh exemplary embodiment, the light-transmittable adhesive layer 190 is interposed between the emission part 180A and the display part 150. For this reason, as compared to a configuration where an air layer is interposed between the emission part 180A and the display part 150, it is possible to suppress the light, which is to be incident from the incidence surface 181 and to be internally reflected toward the display part 150 by the step 184, from being Fresnel reflected on the surface 186 of the emission part 180A facing toward the display part 150. For this reason, since it is possible to cause more light to be incident on the display part 150, it is possible to further suppress the luminance of the light to be emitted from the display part 150 of the reflective display 400 from being lowered. Also, it is possible to suppress the light, which is to be emitted from the display part 150 of the reflective display 400, from being Fresnel reflected on the surface of the emission part 180A facing toward the display part 150. For this reason, it is possible to suppress the luminance of the light, which is to be emitted from the display part 150 and to pass through the emission part 180A, from being lowered. Therefore, it is possible to suppress the visibility of the information to be displayed on the display part 150 from being lowered.

In the seventh exemplary embodiment, the plurality of step regions 183 is located between the pixels 155 of the display part 150, when the emission part 180A is seen from above. For this reason, the steps 184 and the pixels 155 of the display part 150 do not overlap each other, so that it is possible to suppress the information to be displayed on the display part 150 from being visually distorted. For this reason, it is possible to suppress the visibility of the information to be displayed on the display part 150 from being lowered due to the steps 184.

In the seventh exemplary embodiment, when the emission part 180A is seen from above, the plurality of step regions 183 is the regions extending in linear shapes parallel with each other, and the pitch of the step regions 183 is the same as the pitch of the pixels 155 of the display part 150. For this reason, as compared to a configuration where the plurality of step regions 183 does not extend in linear shapes parallel with each other, the productivity of the light guide member 180 can be improved. Also, it is possible to suppress moire, which is caused when the steps 184 and the information to be displayed on the display part 150 interfere with each other, from being generated. For this reason, it is possible to suppress the visibility of the information to be displayed on the display part 150 from being lowered due to the steps 184. In the meantime, from the standpoint of suppressing the moire, which is caused when the steps 184 and the information to be displayed on the display part 150 interfere with each other, from being generated, the pitch of the step regions 183 is preferably obtained by multiplying a natural number by the pitch of the pixels 155 of the display part 150.

In the meantime, from the standpoint of suppressing the visibility of the information to be displayed on the display part 150 from being lowered, when the emission part 180A is seen from above, it is preferable that the plurality of step regions 183 extends in linear shapes parallel with each other and the width W1 in the width direction of the step region 183 is equal to or larger than 0.1 mm and equal to or smaller than 2.5 mm and is also smaller than the width W12 between the step regions 183. With the above configuration, it is difficult for a person to recognize the steps 184, so that it is possible to suppress a situation as if the information to be displayed on the display part 150 superimposed on the steps 184 is visually distorted. For this reason, it is possible to suppress the visibility of the information to be displayed on the display part 150 from being lowered due to the steps 184.

Eighth Exemplary Embodiment

Figure 22:
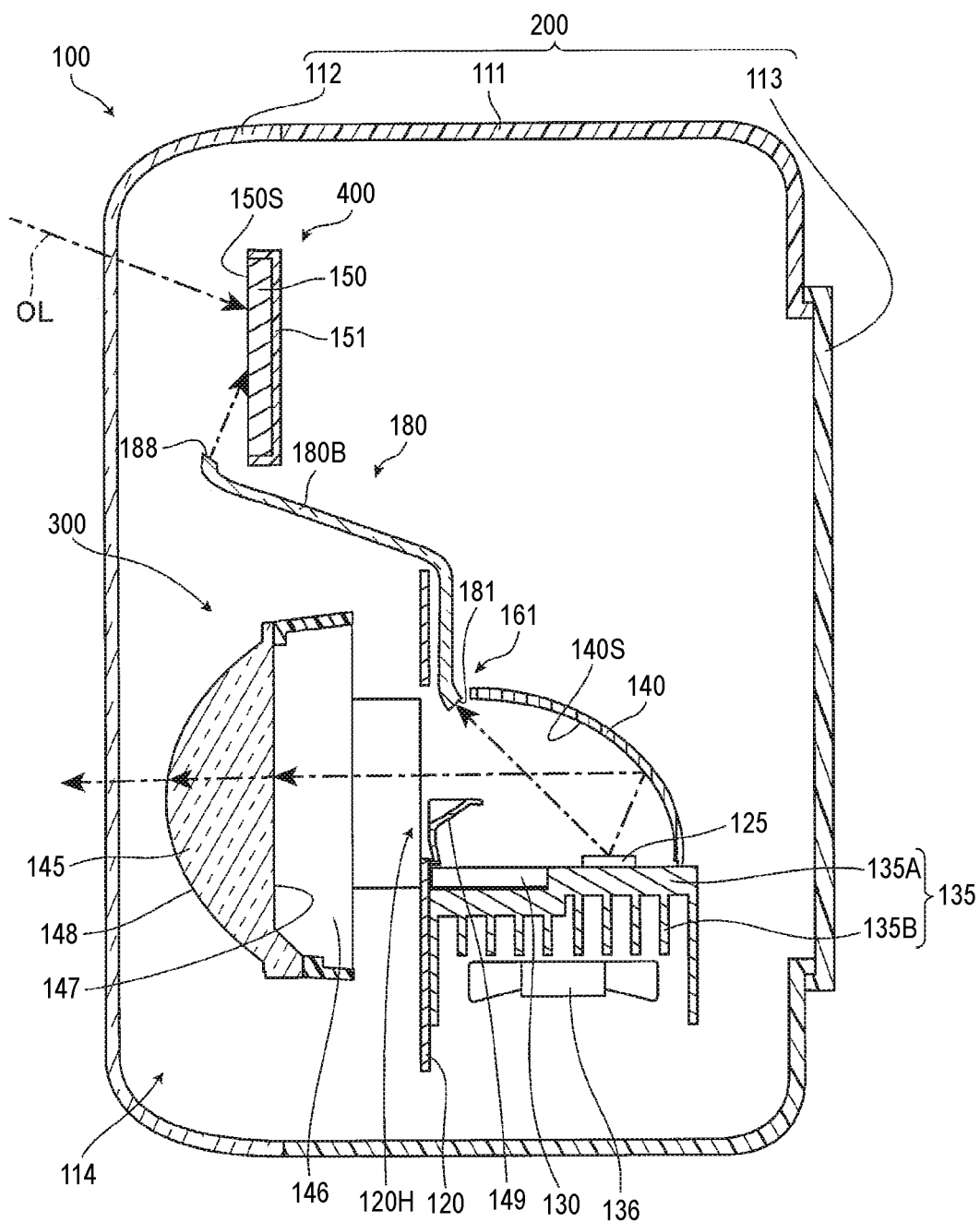
FIG. 22 depicts a vehicular lamp according to an eighth exemplary embodiment of the present invention, in the same manner as FIG. 15.

Subsequently, an eighth exemplary embodiment of the present invention is described in detail with reference to FIG. 22. FIG. 22 depicts a vehicular lamp according to the eighth exemplary embodiment of the present invention, in the same manner as FIG. 15. In the meantime, the constitutional elements, which are the same as or equivalent to the seventh exemplary embodiment, are denoted with the same reference numerals and the overlapping descriptions thereof are omitted, unless particularly described.

As shown in FIG. 22, a headlight 100 that is a vehicular display device of the eighth exemplary embodiment is different from the headlight 100 of the seventh exemplary embodiment, in that the light guide member 180 is not provided with the emission part 180A.

The light guide member 180 of the eighth exemplary embodiment is configured by the plate-shaped light guide part 180B extending in the upper and lower direction. A lower portion of the light guide part 180B is inserted in the opening 161, and a lower side surface that is a lower end portion of the light guide part 180B is formed as the incidence surface 181 on which a part of the light to be emitted from the light source 125 is to be incident. For this reason, the light emitted from the light source 125 and incident on the incidence surface 181 is propagated in the light guide part 180B from the incidence surface 181-side toward the upper side surface that is an opposite side to the incidence surface 181-side. An upper portion of the light guide part 180B is located at an oblique lower part in front of the display part 150 of the reflective display 400. An upper side surface that is an upper end portion of the light guide part 180B is formed as an emission surface 188 configured to emit the light, which is to be incident from the incidence surface 181 and to be propagated in the light guide part 180B, toward the display part 150 of the reflective display 400.

The light guide member 180 of the eighth exemplary embodiment has the incidence surface 181 on which a part of the light to be emitted from the light source 125 of the lamp unit 300 is to be incident, and the emission surface 188 from which the light to be incident from the incidence surface 181 is to be emitted toward the display part 150, like the light guide member 180 of the seventh exemplary embodiment. For this reason, it is possible to guide a part of the light, which is to be emitted from the light source 125 of the lamp unit 300, to a desired position by the light guide member 180. Therefore, as compared to a configuration where the light guide member 180 is not provided, it is possible to improve the degree of design freedom of arrangement and direction of the reflective display 400 with respect to the light source 125 of the lamp unit 300. Also, as compared to a configuration where the light guide member 180 is not provided, the reflective display 400 can be arranged with being spaced from the light source 125 of the lamp unit 300.

Ninth Exemplary Embodiment

Figure 23:
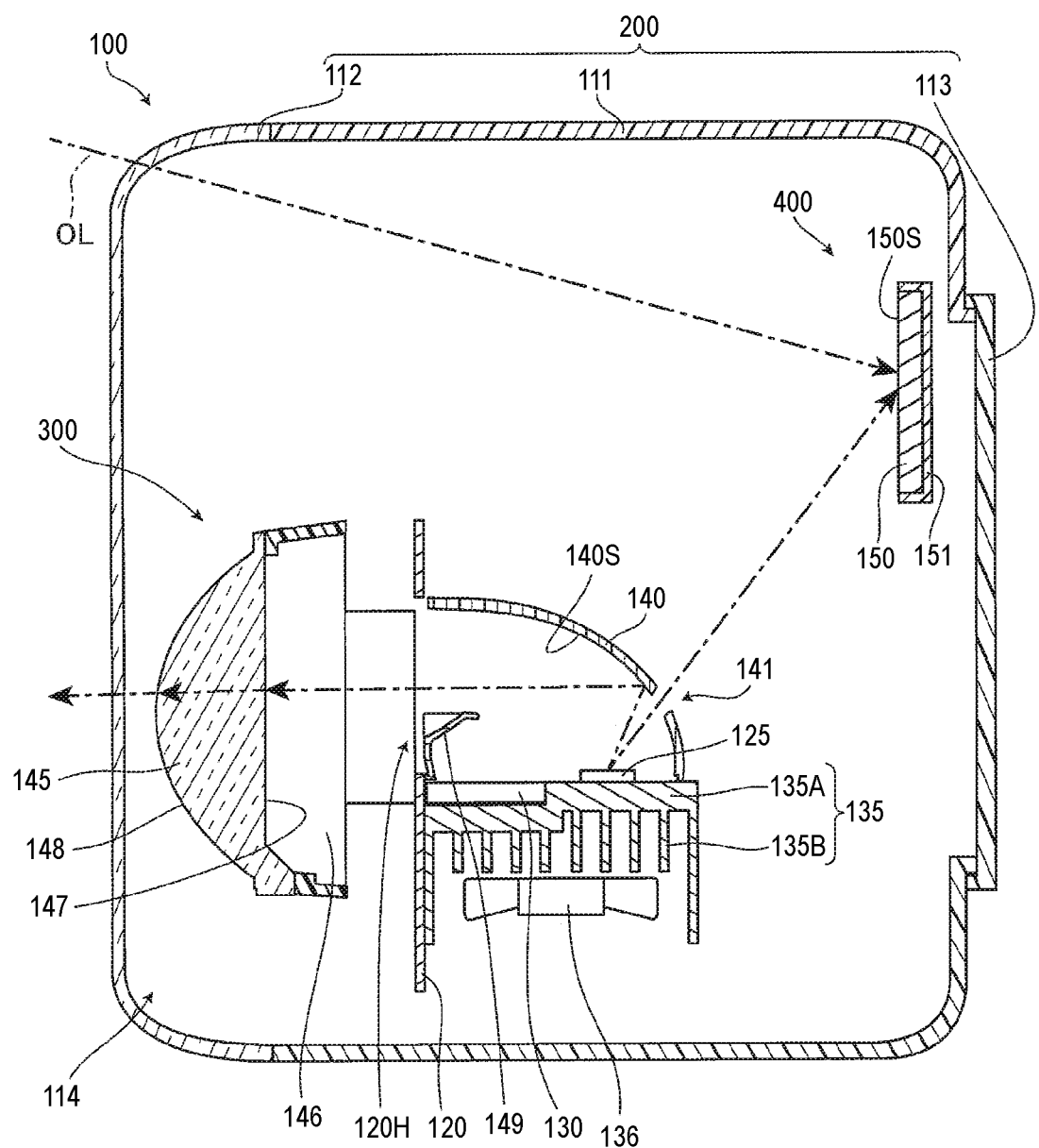
FIG. 23 depicts a vehicular lamp according to a ninth exemplary embodiment of the present invention, in the same manner as FIG. 15.

Subsequently, a ninth exemplary embodiment of the present invention is described in detail with reference to FIG. 23. FIG. 23 depicts a vehicular lamp according to the ninth exemplary embodiment of the present invention, in the same manner as FIG. 15. In the meantime, the constitutional elements, which are the same as or equivalent to the fifth exemplary embodiment, are denoted with the same reference numerals and the overlapping descriptions thereof are omitted, unless particularly described.

As shown in FIG. 23, a headlight 100 that is a vehicular display device of the ninth exemplary embodiment is different from the headlight 100 of the fifth exemplary embodiment, in that the reflective display 400 is arranged at the rear of the reflector 140 of the lamp unit 300 and a part of the reflector 140 is formed with an opening 141.

The reflector 140 of the ninth exemplary embodiment is formed with an opening 141 at the rear of the light source 125. In the ninth exemplary embodiment, a region in which the opening 141 is formed is a region in which most of the light emitted from the light source 125 and reflected is to be shielded by the shade 149. For this reason, the reflector 140 is formed with the opening 141, so that an influence on the light distribution pattern of the light to be emitted from the headlight 100 is suppressed.

In the ninth exemplary embodiment, the reflective display 400 can be visually recognized from the outside of the vehicle through the front cover 112, so that the reflective display 400 can provide display toward the outside of the vehicle. Also, the reflective display 400 is arranged so that a part of the light to be emitted from the light source 125 is to be incident on the display part 150 through the opening 141 and the outside light OL is to be incident on the display surface 150S of the display part 150 through the front cover 112. For this reason, the reflective display 400 can display the information by using the outside light OL including the sunlight, so that it is possible to suppress the visibility of the information from being lowered in the environment where the sunlight is irradiated, as compared to the self-luminous display. Also, the reflective display 400 can provide display by using a part of the light to be emitted from the light source 125 of the lamp unit 300. Therefore, even when an amount of the light OL to be incident on the display part 150 is reduced, the headlight 100 is turned on, so that it is possible to suppress the luminance of the light to be emitted from the display part 150 of the reflective display 400 from being lowered. Also, even when the optical member such as the reflection member, the light guide member and the like configured to guide a part of the light to be emitted from the light source 125 of the lamp unit 300 to the display part 150 is not provided, it is possible to cause a part of the light to be emitted from the light source 125 of the lamp unit 300 to be incident on the display part 150 through the opening 141 of the reflector 140. For this reason, as compared to a configuration where the optical member is provided, it is possible to suppress the number of components from increasing. In the meantime, the reflective display 400 may have the optical member as described above.

Although the present invention has been described with reference to the exemplary embodiments, the present invention is not limited thereto.

For example, in the exemplary embodiments, the headlight 100 that is the vehicular display device has the housing 200, the lamp unit 300, the reflective display 400, and the reflection member 160. However, the vehicular display device may have the reflective display 400 without the lamp unit 300. That is, the vehicular display device and the lamp unit 300 may be separately configured.

Also, in the exemplary embodiments, the reflective display 400 on which a part of the light, which is to be emitted from the light source 125 of the lamp unit 300 of the headlight 100 configured to emit the low beam, is to be incident has been exemplified. However, on the reflective display 400, a part of the light to be emitted from the light source of the lamp configured to emit the light toward the outside of the vehicle may be incident, and the lamp may not be the headlight configured to emit the low beam, and for example, may be a position lamp, a daytime running lamp, a tail lamp or the like. Also, the number of the lamps is not limited, and a part of lights from the plurality of lamps, for example, a part of light from the headlight and a part of the light from the daytime running lamp may be incident on the reflective display 400. In the meantime, the lamp is preferably a lamp configured to be turned on in the dark environment such as night-time. Also, from a standpoint of causing the light from the lamp to be efficiently incident on the reflective display, when the reflective display is arranged at the front part of the vehicle, the lamp is preferably a lamp arranged at the front part of the vehicle, for example, a headlight, a position lamp, a daytime running lamp or the like. In the meantime, when the reflective display is arranged at the rear part of the vehicle, the lamp is preferably a lamp arranged at the rear part of the vehicle, for example, a tail lamp or the like. Also, the color of the light to be emitted from the light source of the lamp is not particularly limited. In the meantime, when the reflective display provides RGB color display, the light source of the lamp is preferably configured to emit the white light. Also, in the exemplary embodiments, the PES optical system is applied to the lamp unit 300. However, a parabola optical system may also be applied. Also, a direct optical system configured to cause the light from the light source to be directly incident on a lens without using the reflector may be applied.

Also, in the exemplary embodiments, the reflective display 400 is not provided with the light source. However, the reflective display may be a reflective display having a backlight that is a light source. Also, in the case where the vehicular display device has the auxiliary light source, like the sixth exemplary embodiment, or the reflective display has the light source such as a backlight, the vehicular display device may further have a sensor configured to detect luminance of the outside of the vehicle, for example, and may be configured to emit the light from the auxiliary light source or the light source of the reflective display, in correspondence to the luminance of the outside of the vehicle, so that the reflective display is to provide display by using the light. With the above configuration, for example, when an amount of the light to be incident on the reflective display is small and the visibility of the reflective display is thus lowered, the reflective display can provide display by using the light from the auxiliary light source, the backlight or the like. For this reason, it is possible to reduce the power consumption that is to be consumed by the auxiliary light source or the light source of the reflective display. Also, the luminance of the light to be emitted from the auxiliary light source or the light source of the reflective display may be changed in correspondence to the luminance of the outside of the vehicle. With the above configuration, it is possible to further reduce the power consumption that is to be consumed by the auxiliary light source or the backlight. Also, in a configuration where the luminance of the light to be emitted from the light source of the lamp can be changed, the light may be emitted from the auxiliary light source or the light source of the reflective display or the luminance of the light to be emitted may be changed, in correspondence to the luminance of the light.

Also, in the exemplary embodiments, the front cover 112 made of the colorless light-transmittable material has been exemplified. However, the front cover 112 may be colored inasmuch as it is light-transmittable. However, the front cover 112 is preferably colorless from a standpoint of efficiently using the light to be incident on the display part 150 through the front cover 112 for display of the display part 150.

Also, in the seventh exemplary embodiment and the eighth exemplary embodiment, the light guide member 180 made of the colorless light-transmittable material has been exemplified. However, the light guide member 180 may be colored inasmuch as it is light-transmittable. However, since the light to be incident on the display part 150 through the light guide member 180 is used for display of the display part 150, the light guide member 180 is preferably colorless when the display part 150 provides display by a plurality of colors of lights, for example.

Also, the light guide member 180 is not particularly limited inasmuch as it has the incidence surface on which a part of the light to be emitted from the light source 125 of the lamp unit 300 is to be incident and the emission surface from which the light to be incident from the incidence surface is to be emitted toward the display part 150. For example, in the seventh exemplary embodiment, the plurality of step regions 183 of the emission part 180A of the light guide member 180 may not be located between the pixels 155 of the display part 150, when the emission part 180A is seen from above. However, from the standpoint of suppressing the visibility of the information to be displayed on the display part 150 from being lowered, the step region 183 of the emission part 180A is preferably located between the pixels 155 of the display part 150.

Also, in the seventh exemplary embodiment, when the emission part 180A is seen from above, the plurality of step regions 183 is the regions extending in linear shaped parallel with each other. However, when the emission part 180A is seen from above, the plurality of step regions 183 may be regions extending intermittently in linear shapes, regions extending in curved shapes or lattice-shaped regions.

Also, in the seventh exemplary embodiment, the pitch of the step regions 183 is the same as the pitch of the pixels 155 of the display part 150. However, from the standpoint of suppressing the moire, which is generated when the step 184 and the information to be displayed on the display part 150 interfere with each other, the pitch of the step regions 183 may be obtained by multiplying a natural number by the pitch of the pixels 155 of the display part 150.

Also, in the seventh exemplary embodiment, the reflection part 182 is configured to internally reflect the light to be incident from the incidence surface 181 toward the display part 150. However, from the standpoint of suppressing the luminance of the light to be emitted from the display part 150 of the reflective display 400 from being lowered, the reflection part 182 is preferably configured to internally reflect the light L12 to be incident from at least the incidence surface 181. With the above configuration, the light L12 to be incident from the incidence surface 181 can be internally reflected on the reflection part 182 toward the steps 184. For this reason, since it is possible to cause more light to be incident on the display part 150, as compared to a configuration where at least a part of the side surface of the emission part 180A is not formed as the reflection part 182 configured to internally reflect the light to be incident from the incidence surface 181, it is possible to further suppress the luminance of the light to be emitted from the display part 150 of the reflective display 400 from being lowered. In the meantime, in this case, the step 184 may be formed as a surface of which the connection surface 184B is inclined relative to the thickness direction of the emission part 180A so that the light reflected on the reflection part 182 is to be internally reflected toward the display part 150, for example.

Also, in the seventh exemplary embodiment, the step 184 is a depression in which the surface 187 of the emission part 180A opposite to the display part 150 is concave toward the display part 150. However, the step 184 is not particularly limited inasmuch as it is configured to internally reflect the light, which is to be incident from the incidence surface 181 and to be propagated in the emission part 180A, toward the display part 150.

Also, in the seventh exemplary embodiment, the light-transmittable adhesive layer 190 is interposed between the emission part 180A and the display part 150. However, the adhesive layer 190 may not be interposed between the emission part 180A and the display part 150, and the emission part 180A may be attached to the member different from the reflective display 400, for example, to the housing 200. However, as described above, from the standpoint of suppressing the visibility of the information to be displayed on the display part 150 from being lowered, the light-transmittable adhesive layer 190 is preferably interposed between the emission part 180A and the display part 150.

Also, in the seventh exemplary embodiment and the eighth exemplary embodiment, the light guide member 180 may further have an incidence surface for outside light on which light to be emitted from a light source located outside the vehicle is to be incident, and the light to be incident on the incidence surface for outside light may be emitted from the emission surface and may be caused to be incident on the display part 150.

Also, in the fifth exemplary embodiment and the sixth exemplary embodiment, a part of the light to be emitted from the light source 125 of the lamp unit 300 is guided to the display part 150 by one reflection member 160. However, the number of the reflection members 160 is not particularly limited. The vehicular display device may have the plurality of reflection members, or a plurality of reflection members each of which is configured to guide a part of the light to be emitted from the light source 125 of the lamp unit 300 to the display part 150. Also, the vehicular display device may be configured to guide a part of the light to be emitted from the light source 125 of the lamp unit 300 to the display part 150 by the plurality of reflection members 160.

Also, in the seventh exemplary embodiment and the eighth exemplary embodiment, a part of the light to be emitted from the light source 125 of the lamp unit 300 is guided to the display part 150 by one light guide member 180. However, the number of the light guide members 180 is not particularly limited. The vehicular display device may have a reflection member and a light guide member each of which is configured to guide a part of the light to be emitted from the light source 125 of the lamp unit 300 to the display part 150. Also, the vehicular display device may be configured to guide a part of the light to be emitted from the light source 125 of the lamp unit 300 to the display part 150 by the reflection member and the light guide member.

Also, in the sixth exemplary embodiment, the auxiliary light source 175 from which the emitted light L11 is directly incident on the display part 150 has been exemplified. However, the light to be emitted from the auxiliary light source has only to be incident on the display part 150. For example, the auxiliary light source may be configured to cause the emitted light to be incident on the display part 150 through the reflection member 160 of the fifth exemplary embodiment or the light guide member 180 of the seventh exemplary embodiment.

Also, in the fifth exemplary embodiment to the eighth exemplary embodiment, at least a part of the light, which is different from the light to be incident on the display part 150, of the light to be emitted from the light source 125 is blocked by the reflector 140 arranged between the light source 125 of the lamp unit 300 and the reflective display 400. However, the vehicular display device may have a light shielding member arranged between the light source 125 and the reflective display 400, and block at least a part of the light, which is different from the light to be incident on the display part 150, of the light to be emitted from the light source 125 by the light shielding member. Even with this configuration, the light, which is different from the light to be incident on the display part 150, of the light to be emitted from the light source 125 of the lamp unit 300 toward the reflective display is blocked by the light shielding member, so that it is possible to suppress the light from being incident on the display part 150. For this reason, it is possible to suppress a person outside the vehicle from being dazzled due to the light, and to suppress the visibility of the information to be displayed on the display part 150 from being lowered. As the light shielding member, for example, a metallic plate-shaped member or the like may be exemplified. However, from the standpoint of suppressing the number of components from increasing, at least a part of the light, which is different from the light to be incident on the display part 150, of the light to be emitted from the light source 125 toward the reflective display 400 is preferably reflected and blocked by the reflector 140 of the lamp unit 300.

According to the present invention, the vehicular display device capable of suppressing the visibility of the information to be displayed from being lowered is provided and can be applied to the field of the vehicle such as an automobile.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A vehicular display device comprising a reflective display configured to provide display toward an outside of a vehicle,
    wherein a part of light to be emitted from a light source of a lamp unit configured to emit light toward the outside of the vehicle is to be incident on a display part of the reflective display,
    wherein the vehicular display device further comprises the lamp unit,
    wherein the lamp unit comprises a reflector arranged between the light source and the reflective display, and
    wherein the reflector has an elliptical curved surface.

2. The vehicular display device according to claim 1, further comprising a reflection member configured to reflect a part of the light to be emitted from the light source and to cause the part of the light to be incident on the display part.

3. The vehicular display device according to claim 1, further comprising a light shielding member arranged between the light source and the reflective display,
    wherein the light shielding member is configured to block at least a part of light of the light to be emitted from the light source, which is different from the light to be incident on the display part.

4. The vehicular display device according to claim 1, wherein the light source is configured to emit white light.

5. The vehicular display device according to claim 1, further comprising an auxiliary light source configured to emit light to be incident on the display part.

6. The vehicular display device according to claim 1, wherein the elliptical curved surface of the reflector reflects at lease a part of the light to be emitted from the light source that is different from the light entering the reflective display.

* * * * *